US012363909B2

(12) United States Patent
Liou et al.

(10) Patent No.: US 12,363,909 B2
(45) Date of Patent: Jul. 15, 2025

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Peng-Chun Liou, Hsinchu (TW); Ya-Yun Cheng, Taichung (TW); Yi-Ching Liu, Hsinchu (TW); Meng-Han Lin, Hsinchu (TW); Chia-En Huang, Xinfeng (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 169 days.

(21) Appl. No.: 18/446,043

(22) Filed: Aug. 8, 2023

(65) Prior Publication Data

US 2023/0403859 A1 Dec. 14, 2023

Related U.S. Application Data

(62) Division of application No. 17/458,237, filed on Aug. 26, 2021, now Pat. No. 11,856,783.

(Continued)

(51) Int. Cl.
*H10B 51/20* (2023.01)
*H10B 51/10* (2023.01)
*H10B 51/30* (2023.01)

(52) U.S. Cl.
CPC ............. *H10B 51/20* (2023.02); *H10B 51/10* (2023.02); *H10B 51/30* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS

2010/0078701 A1\* 4/2010 Shim ...................... H10B 41/30
257/314
2013/0193395 A1\* 8/2013 Lee ...................... H10B 63/845
257/4

(Continued)

FOREIGN PATENT DOCUMENTS

| CN | 112470277 A | \* | 3/2021 | ........... G11C 11/223 |
| KR | 20150054518 A | \* | 5/2015 | ........... G06F 3/0659 |
| TW | 201836128 | | 11/2019 | |

OTHER PUBLICATIONS

Office Action on TW Application No. 11321163900 dated Nov. 15, 2024.

*Primary Examiner* — Matthew E Warren
(74) *Attorney, Agent, or Firm* — FOLEY & LARDNER LLP

(57) ABSTRACT

A semiconductor device comprises a first conductive structure extending along a vertical direction and a second conductive structure extending along the vertical direction. The second conductive structure is spaced apart from the first conductive structure along a lateral direction. The semiconductor device further comprises a plurality of third conductive structures each extending along the lateral direction. The plurality of third conductive structures are disposed across the first and second conductive structures. The first and second conductive structures each have a varying width along the lateral direction. The plurality of third conductive structures have respective different thicknesses in accordance with the varying width of the first and second conductive structures.

20 Claims, 30 Drawing Sheets

Related U.S. Application Data

(60) Provisional application No. 63/156,769, filed on Mar. 4, 2021.

(56) References Cited

U.S. PATENT DOCUMENTS

| | | | |
|---|---|---|---|
| 2014/0126290 A1* | 5/2014 | Sakui | H10D 30/0413 |
| | | | 257/E21.422 |
| 2015/0145021 A1 | 5/2015 | Jang et al. | |
| 2018/0182851 A1* | 6/2018 | Van Houdt | H10B 41/35 |
| 2021/0065806 A1* | 3/2021 | Choi | G11C 16/10 |
| 2021/0143156 A1* | 5/2021 | Song | H10B 12/0387 |
| 2022/0037350 A1* | 2/2022 | Billingsley | H10B 41/30 |
| 2022/0068964 A1* | 3/2022 | Kuki | H01L 21/32134 |

* cited by examiner

SEMICONDUCTOR MEMORY DEVICES
AND METHODS OF MANUFACTURING
THEREOF

CROSS-REFERENCE TO RELATED APPLICATION

This application is a divisional of U.S. patent application Ser. No. 17/458,237, filed Aug. 26, 2021, titled "SEMICONDUCTOR MEMORY DEVICES AND METHODS OF MANUFACTURING THEREOF," which claims priority to and the benefit of U.S. Provisional Application No. 63/156,769, filed Mar. 4, 2021, titled "3D MEMORY DEVICE WITH LAYER-DEPENDENT WL THICKNESS," the disclosures of both of which are incorporated herein by reference in their entireties for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
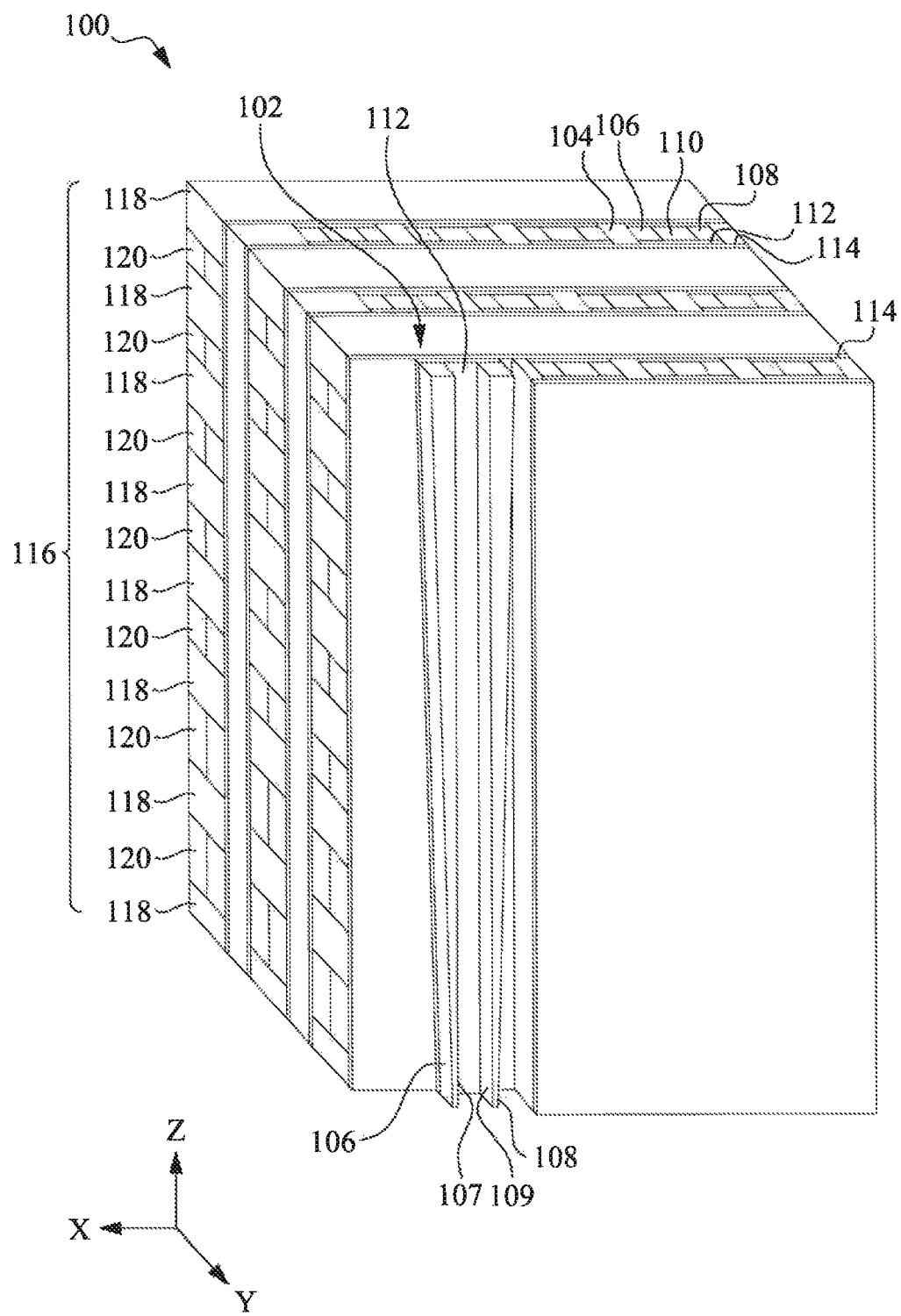
FIG. 1 is a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a plurality of gate layers. The memory cells are formed across multiple memory levels (or tiers) over a substrate. For example, each memory cell can be constituted by at least one of: a portion of a semiconductor channel layer that continuously extends along a vertical direction of the array, a portion of a memory film that continuously extends along the vertical direction, a first conductive structure (functioning as a drain electrode) that continuously extends along the vertical direction, a second conductive structure (functioning as a source electrode) that continuously extends along the vertical direction, and one of a plurality of third conductive structures (functioning as gate electrodes) that continuously extend along a first lateral direction of the array. The drain electrode, source electrode, and gate electrode may sometimes be referred to as "bit line (BL)," "source/select line (SL), and "word line (WL)," respectively.

In some cases, the memory array can include a certain number of memory levels (e.g., about 16 memory levels), which causes the BLs/SLs to have a relatively high aspect ratio or ratio of the height to the width. With such a high aspect ratio, the BLs and SLs can be formed as having a tapered profile. Generally, the channel length of a memory cell is defined as the length of a portion of a semiconductor channel that is interposed between the BL and SL. Alternatively stated, the channel length may correspond to the distance separating respective (inner) sidewalls of the BL and the SL along a lateral direction. Because of the tapered profile of the BL and SL, the respective channel lengths of memory cells arranged along a vertical direction (which are sometimes referred to as a memory string) can vary. For example, when the BL and SL are formed to have a wider upper portion and a narrower lower portion, the channel length of a memory cell disposed at a lower level may be longer than the channel length of a memory cell disposed at a higher level. Such non-uniform (or otherwise varying) channel lengths can disadvantageously impact overall performance of the memory array. As the current level of each memory cell is generally proportional to its channel length, the varying channel lengths result in varying levels of cell current. For example, a longer (or longer than expected) channel length can lead to an undesired, insufficient cell current level, while a shorter (or shorter than expected) channel length can lead to an undesired, overwhelming cell current level.

Embodiments of the present disclosure are discussed in the context of forming a semiconductor device, and particularly in the context of forming a 3D memory device, that can compensate for varying cell currents. In accordance with various embodiments, even with the tapered profile of the BL and SL being formed which causes a varying channel length, the 3D memory device, as disclosed herein, includes a plurality of word lines that have varying thicknesses to compensate for the varying channel length. For example, a lower cell current due to a longer channel length may be compensated by a thicker word line; and a higher cell current due to a shorter channel length may be compensated by a thinner word line. As such, the current levels of a number of memory cells (e.g., the memory cells of a memory string) can be adjusted to be uniform. Alternatively or additionally, by controlling the thickness of the word lines to vary in the direction where memory cells are arranged, current levels of those memory cells can be accordingly modulated, as desired. The relationship between cell current and word line thickness is demonstrated in the following Equation 1:

$$I_D = \frac{\mu_n C_{ox}}{2} \frac{W}{L}(V_{GS} - V_{th})^2 \quad [1]$$

Equation 1 is directed towards MOSFET devices, such as a memory cell in the present disclosure. In Equation 1, the cell current ($I_D$) is positively proportional to channel width (W). The channel width can be defined as the thickness of the word lines in the present disclosure. Therefore, the desired cell current can be achieved by modulating the word line thickness. Other parameters that proportionally influence the cell current are carrier mobility ($\mu_n$), gate capacitance ($C_{ox}$), and the squared difference between the voltage difference between the gate electrode and the source ($V_{GS}$) and the threshold voltage ($V_{th}$). In some embodiments, the drain and the source of the device may be n-doped, and the substrate may be P-type, resulting in a carrier mobility of $\mu_n$. In some embodiments, the drain and the source of the device may be p-doped, and the substrate may be N-type, resulting in a carrier mobility of $\mu_p$.

FIG. 1 illustrates a perspective view of a semiconductor device 100, in accordance to some embodiments. The semiconductor device 100 includes an array of memory cells 102. The semiconductor device may be disposed on a substrate (e.g., a silicon, or silicon on insulator (SOI) substrate) (not shown). When viewed from the top, such an array may be arranged in a column-row configuration, e.g., having a number of rows extending along a first lateral direction (e.g., the X-direction) and a number of columns extending along a second lateral direction (e.g., the Y-direction). Within each row, a number of memory cells 102 can be separated and electrically isolated from one another by an isolation structure 104. Each memory cell 102 can include a source line (SL) 106 and a bit line (BL) 108 separated and electrically isolated from each other by an inner spacer 110.

The semiconductor device 100 can include one or more semiconductor channels 112. The semiconductor channel 112, extending along the vertical direction (e.g., the Z-direction), can be disposed along each of the opposite surfaces (or sidewalls) of the SL 106 and BL 108 in the Y-direction, which may be better seen in the cut-out portion of FIG. 1. Each semiconductor channel 112 can extend in the first lateral direction (e.g., the X-direction), with itself physically separated or electrically isolated from another semiconductor channel 112 within the row (along the X-direction).

The semiconductor device 100 can include one or more memory films 114. The memory film 114, extending along the vertical direction (e.g., the Z-direction), can be disposed along a surface (or sidewall) of each semiconductor channel 112 opposite from the SL 106 and BL 108 in the Y-direction. The memory film 114 can extend in the first lateral direction (e.g., the X-direction).

In some embodiments, a number of memory cells 102 can be defined in the semiconductor device 100. A memory cell 102 can be constituted by a BL, a SL, a portion of a semiconductor channel, a portion of a memory film, and a word line (WL) (which will be discussed below). In the configuration of example FIG. 1, within one of the rows of the array, a number of memory cells 102 can be formed on the opposite sides of each pair of the BL and SL. For example, a first memory cell 102 can be partially defined by a portion of a memory film 114 and a portion of a semiconductor channel 112 disposed on one side of each pair of SL 106 and BL 108, and a second memory cell 102 can be partially defined by a portion of a memory film 114 and a portion of a semiconductor channel 112 disposed on the other side of that pair of SL 106 and BL 108. Alternatively stated, these two memory cells 102 may share one pair of BL and SL. Further, each row can extend along the vertical direction (e.g., the Z-direction) to include an additional number of memory cells, thereby forming a number of memory strings. It should be understood that the semiconductor device 100 shown in FIG. 1 is merely an illustrative example, and thus, the semiconductor device 100 can be formed in any of various other 3D configurations, while remaining within the scope of present disclosure.

The semiconductor device 100 also includes a plurality of WLs 120 and a plurality of insulating layers 118 alternatively stacked on top of one another in the vertical direction (e.g., the Z-direction) which form a stack 116 disposed on outer surfaces of the memory film 114 (along the Y-direction), such that the stack 116 can be interposed between adjacent rows of memory cells 102. Each of the plurality of WLs 120 can have a varying thickness along the vertical direction (e.g., the Z-direction). For example, the bottommost WL closest to the substrate may be thicker than the topmost WL. In such embodiments, the thickness of the WLs may decrease in each of the WLs between the bottommost WL and the topmost WL. In such embodiments, the thicker WLs may provide a larger contact area with the semiconductor channel 112 and may provide for an increase in cell current when needed. In some embodiments, the thinner WLs may provide a smaller contact area with the semiconductor channel 112 and may provide for a decrease in cell current when needed. In some embodiments, a topmost layer and a bottommost layer of the stack 116 may include an insulating layer 118 of the plurality of insulating layers 118. The bottommost insulating layer 118 may be disposed on the substrate.

Each of the plurality of WLs 120 extends in semiconductor device 100 along the respective row of memory cells 102 along the first lateral direction (e.g. the X-direction). The insulating layers 118 may also extend along the first lateral direction (e.g., the X-direction). Two parallel WLs 120 may be located adjacent to each other in a second lateral direction that is perpendicular to the first lateral direction and in the same plane (e.g., the Y-direction), and may be interposed between two vertically separated insulating layers 118. In some embodiments, an adhesive layer 122 may be interposed between the WLs 120 and the adjacent insulating layers 118, and facilitate adhesion of the WL 120 to the insulating layer 118, and may also serve as a spacer between two parallel WLs 120 that are interposed between the same vertically separated insulating layers 118. In some embodiments, the adhesive layer 122 is optional.

As a representative example in FIG. 1, one of a number memory cells 102 can be defined by the SL 106, the BL 108, a portion of the semiconductor channel 112, a portion of the memory film 114, and one of the WLs 120. The SL 106 has an inner sidewall 107 and the BL 108 has an inner sidewall 109, a distance of which can define the channel length of such a memory cell. When the SL and the BL are formed in a tapered profile, as shown in FIG. 1, respective channel lengths of the memory cells arranged in the Z-direction may vary. In some embodiments, the thickness of the WLs 120 are directly proportional the channel length. As shown in Equation 1 discussed above, the thickness of the WLs 120 can be modified to compensate for a more controllable overall performance of the semiconductor device 100.

Figure 2A:
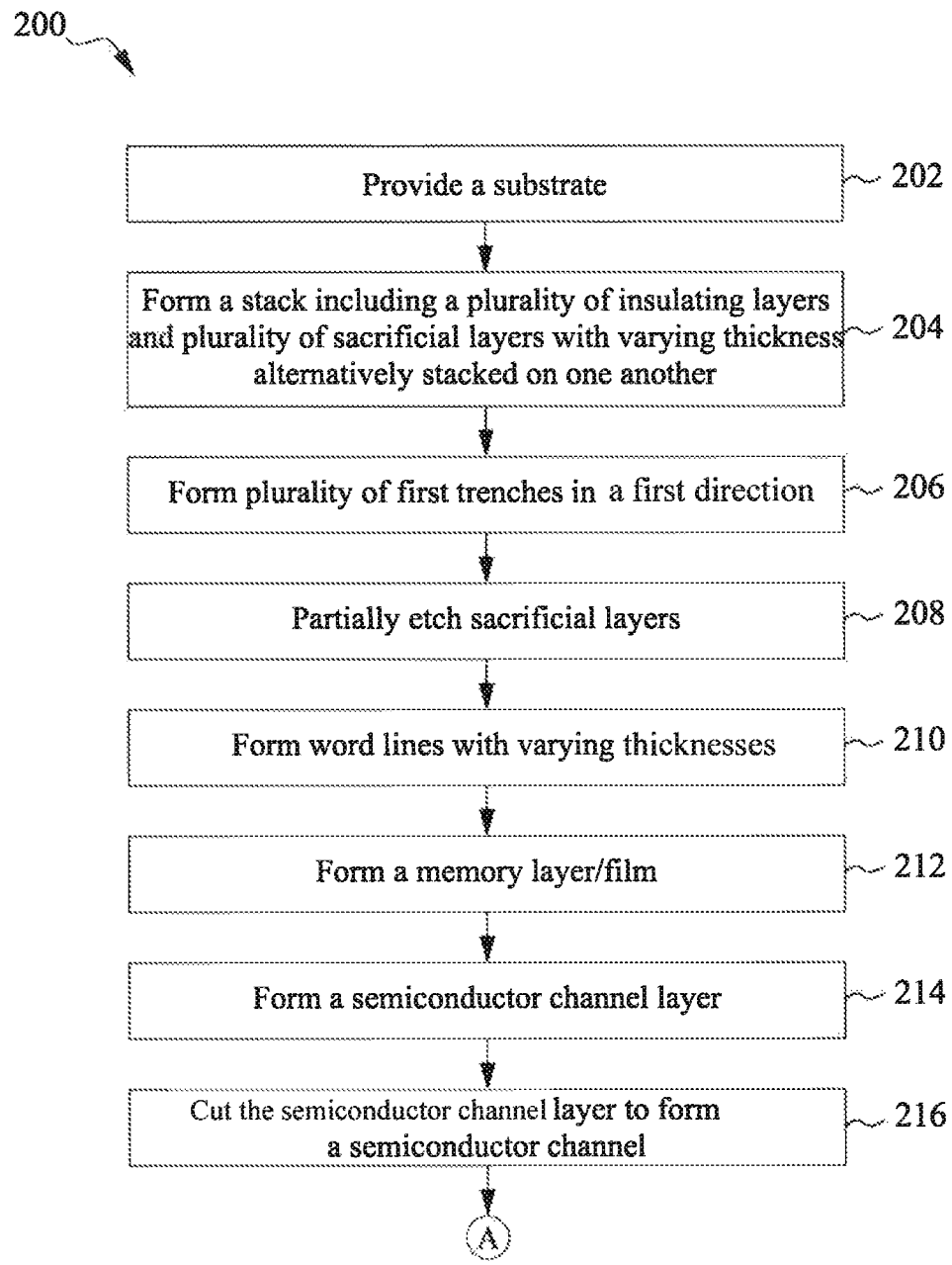
FIGS. 2A-B are an example flow chart of a method for forming a semiconductor device, in accordance with some embodiments.
Figure 2B:
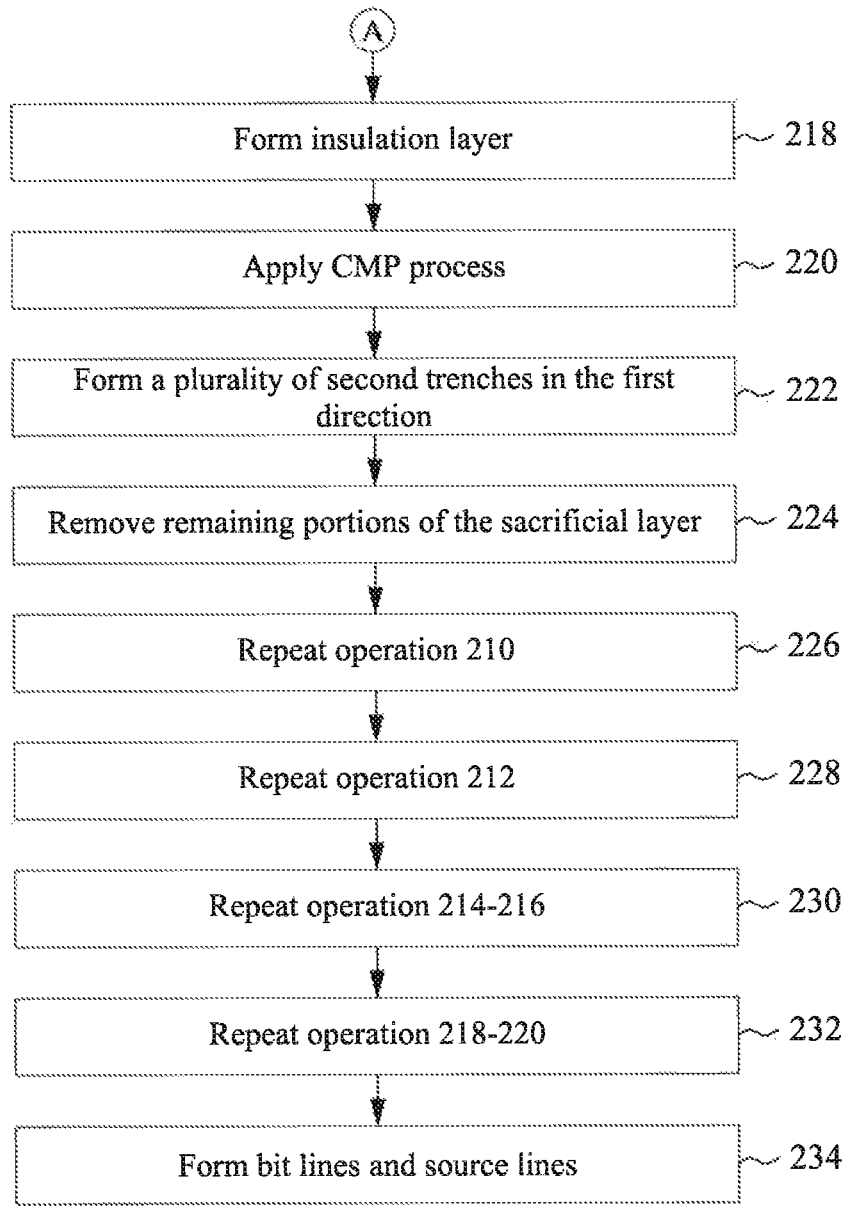

FIGS. 2A-B illustrate a flowchart of an example method 200 for forming a semiconductor device 300, for example, a 3D memory device (e.g., the semiconductor device described with respect to FIG. 1), in accordance with some embodiments. It should be noted that the method 200 is merely an example, and is not intended to limit the present disclosure. Accordingly, it is understood that the order of operation of the method 200 of FIGS. 2A-B can change, that additional operations may be provided before, during, and after the method 200 of FIGS. 2A-B, and that some other operations may only be described briefly described herein.

In some embodiments, operations of the method 200 may be associated with perspective views of the example semiconductor device 300 at various fabrication stages as shown in FIGS. 3, 4, 5, 6, 7, 8, 9, 10, 11, 12, and 13A. In addition, the operations of the method 200 are equally applicable to any other semiconductor device, for example, a semiconductor device 400 shown in FIG. 12, a semiconductor device 500 shown in FIG. 14, or any other semiconductor device. Although FIGS. 3-13A illustrate the semiconductor device 300 including a plurality of memory cells, it should be understood the semiconductor device 300, 400, or 500 may include a number of other devices such as inductors, fuses, capacitors, coils, etc., which are not shown in FIGS. 3-13C, 15, and 17, for purposes of clarity of illustration.

In a brief overview, the method 200 may start with the operation 202 in which a semiconductor substrate is provided. The method 200 continues to operation 204 in which a stack is provided wherein the stack comprises a plurality of insulating layers and a plurality of sacrificial layers with varying thicknesses alternatively stacked on top of each other. The method 200 continues to operation 206 in which a plurality of trenches extending in a first lateral direction (e.g., the X-direction) are formed. The method 200 continues to operation 208 in which the plurality of sacrificial layers are partially etched. The method 200 continues to operation 210 in which a plurality of word lines with varying thicknesses are formed. The method 200 continues to operation 212 in a memory layer or memory film is formed. The method 200 continues to operation 214 wherein a semiconductor channel layer is formed. The method 200 continues to operation 216 in which the semiconductor channel layer is cut to form a semiconductor channel.

The method 200 continues to operation 218 in which an insulation layer is formed. The method 200 continues to operation 220 in which a chemical mechanical polish (CMP) process applied which may remove any excess insulation material. The method 200 continues to operation 222 in which a plurality of second trenches are formed in the first direction. The method 200 continues to operation 224 in which the remaining portions of the sacrificial layer are removed. The method 200 continues to operation 226 in which operation 210 (forming word lines with varying thicknesses) is repeated. The method 200 continues to operation 228 in which operation 212 (forming a memory layer or film) is repeated. The method 200 continues to operation 230 in which operations 214-216 (forming and cutting semiconductor channel layer) are repeated. The method 200 continues to operation 232 in which operations 218-220 (forming an insulation layer and applying a CMP process) are repeated. The method 200 continues to operation 234 in which bit lines and source lines are formed.

Figure 3:
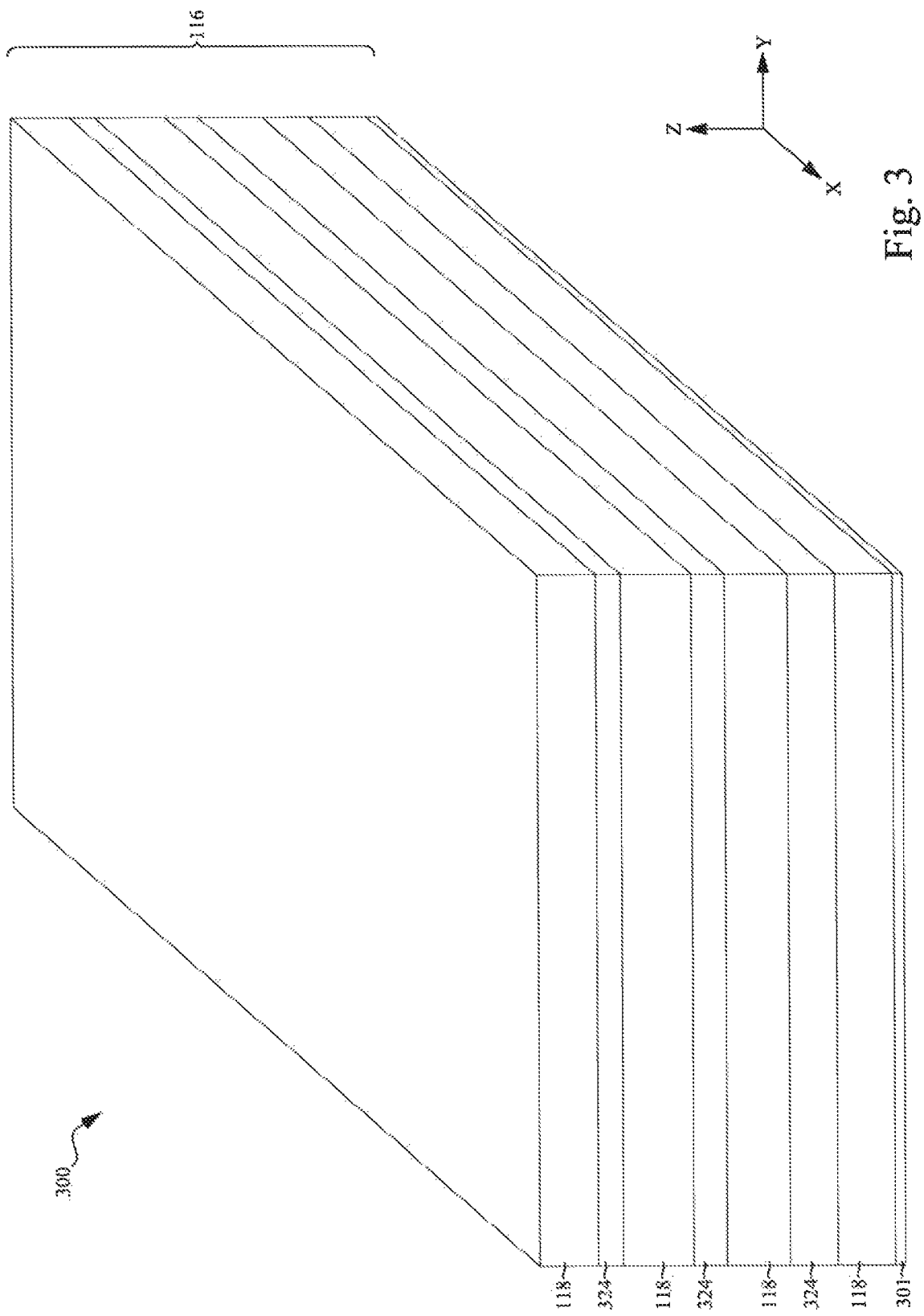
FIGS. 3, 4, 5, 6, 7, 8, 9, 10, 11, 12, and 13A illustrate perspective views of an example semiconductor device (or a portion of the example semiconductor device) during various fabrication stages, made by the method of FIGS. 2A-B, in accordance with some embodiments.

Corresponding to operations 202-204 of FIG. 2A, FIG. 3 is a perspective view of a semiconductor device 300 including a substrate 301 and a stack 116, in accordance with some embodiments.

The substrate 301 may be a semiconductor substrate, such as a bulk semiconductor, a semiconductor-on-insulator (SOI) substrate, or the like, which may be doped (e.g., with a p-type or an n-type dopant) or undoped. The substrate 301 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 301 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The stack 116 is formed on the substrate 301. The stack includes a plurality of insulating layers 118 and a plurality of sacrificial layers 324 alternately stacked on top of each other in the vertical direction (e.g., the Z-direction). For example, one of the sacrificial layers 324 is disposed over one of the insulating layers 118, then another one of the insulating layers 118 is disposed on the sacrificial layer 324, so on and so forth. The plurality of sacrificial layers 324 are formed with varying thicknesses. For example, the bottommost sacrificial layer 324 (e.g., a layer most proximate to the substrate 301) may have a larger thickness in the Z-direction than the topmost sacrificial layer 324 (e.g., a layer distanced most from the substrate 301). In some embodiments, the thickness of the sacrificial layers 324 decreases from the bottommost sacrificial layer 324 to the topmost sacrificial layer 324.

In some embodiments, the stack 116 can include a first (e.g., lower) portion and a second (e.g., upper) portion with their respective sacrificial layers 324 having increasing and/or decreasing thicknesses along an increasing height in the Z-direction. For example, the plurality of sacrificial layers 324 may have increasing thicknesses along the first portion and the plurality of sacrificial layers 324 may have decreasing thicknesses along the second portion, with an increasing height in the Z-direction. Alternatively stated, the thicknesses of the sacrificial layers 324 of the stack 116 can monolithically increase along a vertical direction away from the substrate 301. In another example, the plurality of sacrificial layers 324 may have increasing thicknesses along the first portion and the plurality of sacrificial layers 324 may have decreasing thicknesses along the second portion, with an increasing height in the Z-direction. Alternatively stated, the thicknesses of the sacrificial layers 324 of the stack 116 can first increase and then decrease along a vertical direction away from the substrate 301. In yet another example, the plurality of sacrificial layers 324 may have decreasing thicknesses along the first portion and the plurality of sacrificial layers 324 may have increasing thicknesses along the second portion, with an increasing height in the Z-direction. Alternatively stated, the thicknesses of the sacrificial layers 324 of the stack 116 can first decrease and then increase along a vertical direction away from the substrate 301.

As shown in FIG. 3, a topmost layer (e.g., a layer distanced most from the substrate 301) and a bottommost layer (e.g., a layer most proximate to the substrate 301) of the stack 116 may include an insulating layer 118. While FIG. 3 shows the stack 116 as including 4 insulating layers 118 and 3 sacrificial layers 324, the stack 116 may include any number of insulating layers 118 and sacrificial layers 324 (e.g., 4, 5, 6, 7, 8, or even more). In various embodiments, if the number of sacrificial layers 324 in the stack 116 is n, a number of insulating layers 118 in the stack 116 may be n+1.

The plurality of insulating layers 118 may have the same or different thickness from one another. For example, the thickness of an insulating layer 118 may be in a range of about 5 nm to about 100 nm, inclusive. The sacrificial layers 324 may have different thickness from one another, as described above. The thickness of a sacrificial layers 324 may range from a few nanometers to few tens of nanometers (e.g., in a range of 5 nm to 100 nm, inclusive). It is understood that the thickness of the insulating layers 118 and the sacrificial layers 324 can be any other suitable thickness.

The insulating layers 118 and the sacrificial layers 324 have different compositions. In various embodiments, the insulating layers 118 and the sacrificial layers 324 have compositions that provide for different oxidation rates and/or different etch selectivity between the respective layers. The insulating materials that can be employed for the insulating layer 118 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure.

The sacrificial layers 324 may include an insulating material, a semiconductor material, or a conductive material. Non-limiting examples of the sacrificial layers 324 include silicon nitride, an amorphous semiconductor material (such as amorphous silicon), and a polycrystalline semiconductor material (such as polysilicon). In some embodiments, the insulating layers 118 may be formed from $SiO_2$, and the sacrificial layers 324 may be formed from SiN. The sacrificial layers 324 are spacer layers that will eventually be removed and do not form an active component of the semiconductor device 300.

In various embodiments, the insulating layers 118 and/or the sacrificial layers 324 may be grown over the substrate 301. For example, each of the insulating layers 118 and the sacrificial layers 324 may be formed by a molecular beam epitaxy (MBE) process, a chemical vapor deposition (CVD) process such as a metal organic CVD (MOCVD) process, a furnace CVD process, an atomic layer deposition (ALD) process, and/or other suitable growth processes.

Figure 4:
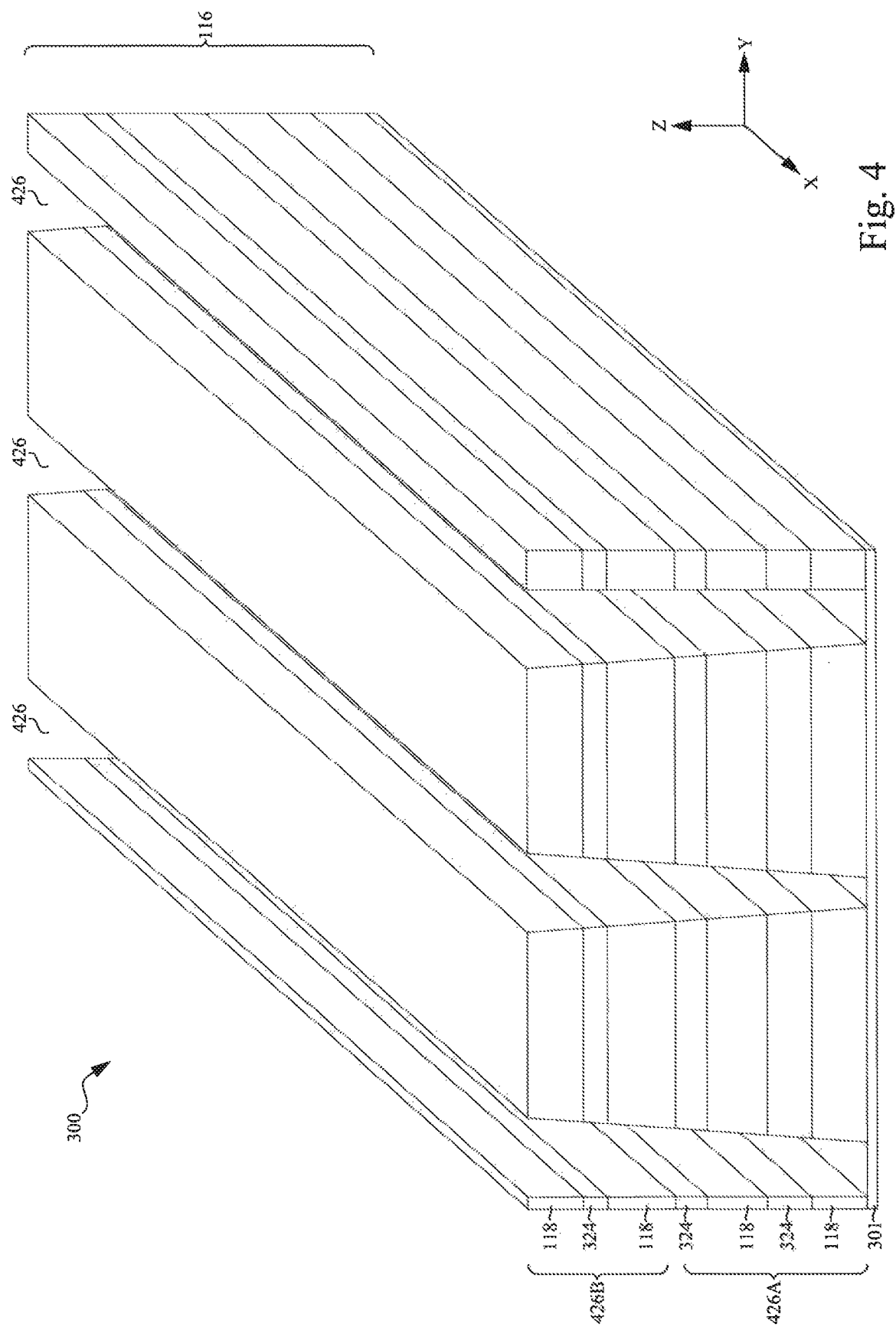

Corresponding to operation 206 of FIG. 2A, FIG. 4 is a perspective view of the semiconductor device 300 with a plurality of first trenches 426 formed through the stack extending in the X-direction, in accordance with some embodiments. Although three first trenches 426 are shown in the embodiment of FIG. 4, it should be understood that the semiconductor device 300 can include any numbers of first trenches 426 while remaining within the scope of the present disclosure.

The plurality of first trenches 426 extending in the X-direction, have been formed through the stack 116 up to the substrate 301 by etching the stack 116 in the Z-direction. The etching process for forming the plurality of first trenches 426 may include a plasma etching process, which can have a certain amount of anisotropic characteristic. For example, the first trenches 426 may be formed, for example, by depositing a photoresist or other masking layer on a top surface of the semiconductor device 300, i.e., the top surface of the topmost insulating layer 118 of the stack 116, and a pattern corresponding to the first trenches 426 defined in the masking layer (e.g., via photolithography, e-beam lithography, or any other suitable lithographic process).

The first trenches 426 may be formed using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 426.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 4, the etch used to form the plurality of first trenches 426 etches through each of the sacrificial layers 324 and insulating layers 118 of the stack 116 such that each of the plurality of first trenches 426 extend from the topmost insulating layer 118 through the bottommost insulating layer 118 to the substrate 301. In other embodiments, a hard mask may be used. In some embodiments, the first trenches 426 may be formed with a varying width along, the Y-direction. In some embodiments, the first trenches 426 may be etched with an increasing width as the height of first trench 426 increases in the Z-direction, as shown in FIG. 4. In some embodiments, the upper portion of the first trench 426 may be exposed to more etchants in order to create the varying width.

In some embodiments, the first trenches 426 may have a first portion 426A and a second portion 426B along the Z-direction. In some embodiments, the width of the first trenches 426 may decrease along the first portion 426A and increase along the second portion 426B with an increasing height along the Z-direction. In some embodiments, the width of the first trenches 426 may increase along the first portion 426A and decrease along the second portion 426B with an increasing height along the Z-direction.

Figure 5:
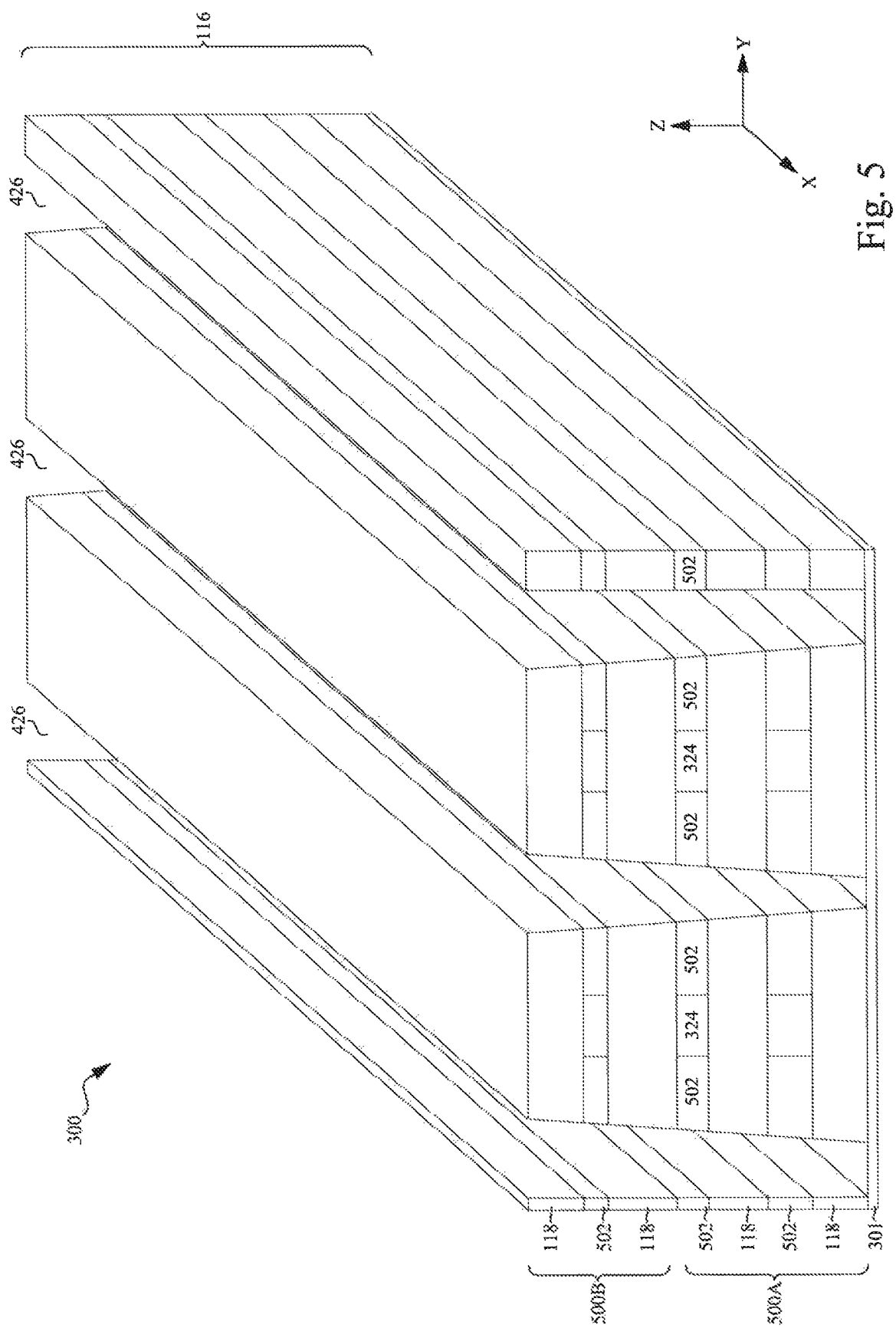

Corresponding to operations 208-210 of FIG. 2A, FIG. 5 is a perspective view of the semiconductor device 300 with a plurality of word lines 502 formed after partially etching the sacrificial layers 324 within the first trenches 426, in accordance with some embodiments.

At operation 208, the exposed surfaces of the sacrificial layers 324 within the trenches are partially etched so as to reduce a width of the sacrificial layers 324 relative to the insulating layers 118 in the stack 116 (not shown). The exposed surfaces extend in the X-direction, and etching the exposed surfaces of the sacrificial layers 324 reduces a width of the insulating layers 118 on either side of the sacrificial layers 324 in the Y-direction. In some embodiments, the sacrificial layers 324 may be etched using a wet etch process (e.g., hydrofluoric etch, buffered hydrofluoric acid). In other embodiments, the exposed surfaces of the sacrificial layers 324 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers 324 in the Y-direction reduces a width of the sacrificial layers 324 relative to the insulating layers 118 disposed in the stack 116 such that first cavities are formed whose boundaries are formed by top and bottom surfaces of adjacent insulating layers 118 and a surface of the partially etched sacrificial layers 324 that face the first trenches 426 and extend in the X-direction (not shown).

In some embodiments, an adhesive layer is then formed on sidewalls of the FIRST cavities (not shown). In some embodiments, the adhesive layer is optional. In various embodiments, the adhesive layers may include a material that has good adhesion with each of the insulating layers 118, the sacrificial layers 324, and the word lines 502, for example, Ti, Cr, etc. In some embodiments, the adhesive layer (e.g., the adhesive layer 122) may include e.g., titanium (Ti), chromium (Cr), or any other suitable adhesive material. The adhesive layers may be deposited using any suitable method including, for example, molecular beam deposition (MBD), atomic layer deposition (ALD), PECVD, and the like. In some embodiments, the adhesive layer may have a thickness in a range of 0.1 nm to 5 nm, inclusive, or any other suitable thickness.

At operation 210, a plurality of word lines 502 (sometimes referred to as gate layers, conductive structures, or WLs) are formed in the first cavities located in the trenches. The exposed edges of the word lines may be etched back such that the edges of the word lines 502 facing the trenches are axially aligned in the Z-direction with corresponding edges of the insulating layers 118 disposed adjacent thereto, as shown in FIG. 5.

In various embodiments, the word lines 502 are formed by filling a gate metal in the cavities over the optional adhesive layer, such that the word lines 502 inherit the dimensions and profiles of the cavities. The word lines 502 may inherit the varying thicknesses of the sacrificial layers 324. In some embodiments, the bottommost word line 502 may have a larger thickness than the topmost word line 502, as shown in FIG. 5. In such embodiments, the word lines 502 in between the bottommost word line 502 and the topmost word line 502 may have a decreasing thickness along the Z-direction. The thicker word lines 502 provide a larger contact area with a later-formed semiconductor channel which allows more current to travel between the semiconductor channel and the word lines 502. The thickness of the word line 502 may provide the desired cell current to a memory cell (described later). As shown in Equation 1 above, the cell current is directly proportional to the thicknesses of the word lines 502.

In some embodiments, the plurality of word lines 502 are comprised of a first portion 500A and a second portion 500B along an increasing height in the Z-direction. In some embodiments, the thickness of the formed word lines 502 increases along the first portion 500A and decrease along the second portion 500B. In some embodiments, the thickness of the word line 502 decrease along the first portion 500A and increase along the second portion 500B.

The word lines 502 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The word lines 502 can be formed by overlaying the workpiece with the above-listed metal material by, for example, chemical vapor deposition (CVD), physical vapor deposition (PVD), electroless plating, electroplating, or combinations thereof.

Although each word line 502 shown in FIG. 5 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ (sometimes referred to as $V_{th}$) is achieved in the device that is to be formed. The work function layer(s) may be deposited by CVD, physical vapor deposition (PVD), ALD, and/or other suitable processes.

Formation of the word lines 502 in the first cavities may cause edges of the word lines 502 in the Y-direction to protrude outwards of the cavities, i.e., outwards of the corresponding edges of the insulating layers 118, and/or the material forming the word lines 502 may also be deposited on exposed surfaces of the insulating layers 118 that face the first trenches 426 and/or the substrate 301. The protruding edges of the word lines 502 are etched, for example, using a selective wet etching or dry etching process (e.g., RIE, DRIE, etc.) until any gate material deposited on the surfaces of the insulating layers 118 and/or the substrate 301, and edges of the word lines 502 facing the first trenches 426 are substantially axially aligned with corresponding edges of the insulating layers 118.

Figure 6:
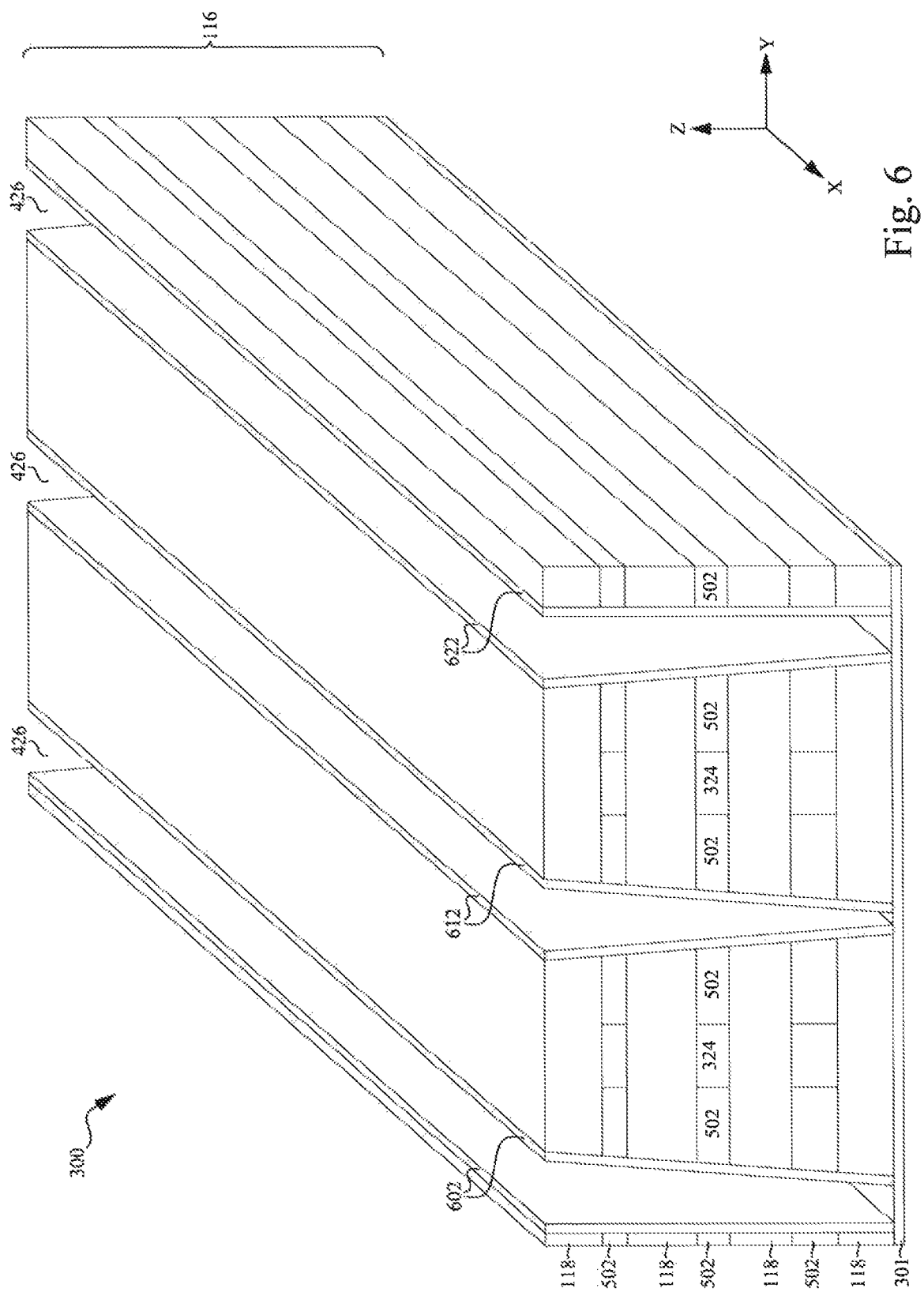

Corresponding to operations 212 of FIG. 2A, FIG. 6 is a perspective view of the semiconductor device 300 in which memory layers 602, 612, and 622 are formed in each of plurality of first trenches 426 on exposed surfaces of the insulating layers 118 and the word lines 502 located in the first trenches 426, such that the memory layers 602-622 continuously extend along the X-direction, in accordance with some embodiments.

The memory layers 602-622 may include a ferroelectric material, for example, lead zirconate titanate (PZT), PbZr/TiO$_3$, BaTiO$_3$, PbTiO$_2$, or combinations thereof, etc. However, it should be understood that the memory layers 602-622 can include any of various other materials that are suitable as in memory devices, while remaining within the scope of the present disclosure. For example, the memory layers 602-622 can include a material selected from the group consisting of: HfO$_2$, Hr$_{1-x}$Zr$_x$O$_2$, ZrO$_2$, TiO$_2$, NiO, TaO$_x$, Cu$_2$O, Nb$_2$O$_5$, AlO$_x$, any other suitable material, or combinations thereof. The memory layers 602-622 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the memory layers 602-622 are continuous on the walls of the first trenches 426. In some embodiments, a CMP operation may be performed after forming the memory layers 602-622 so that they will lie in the same X-Y plane or are level with a top surface of the topmost insulating layer 118. After formation, the memory layers 602-622 may sometimes be referred to as memory films.

Figure 7:
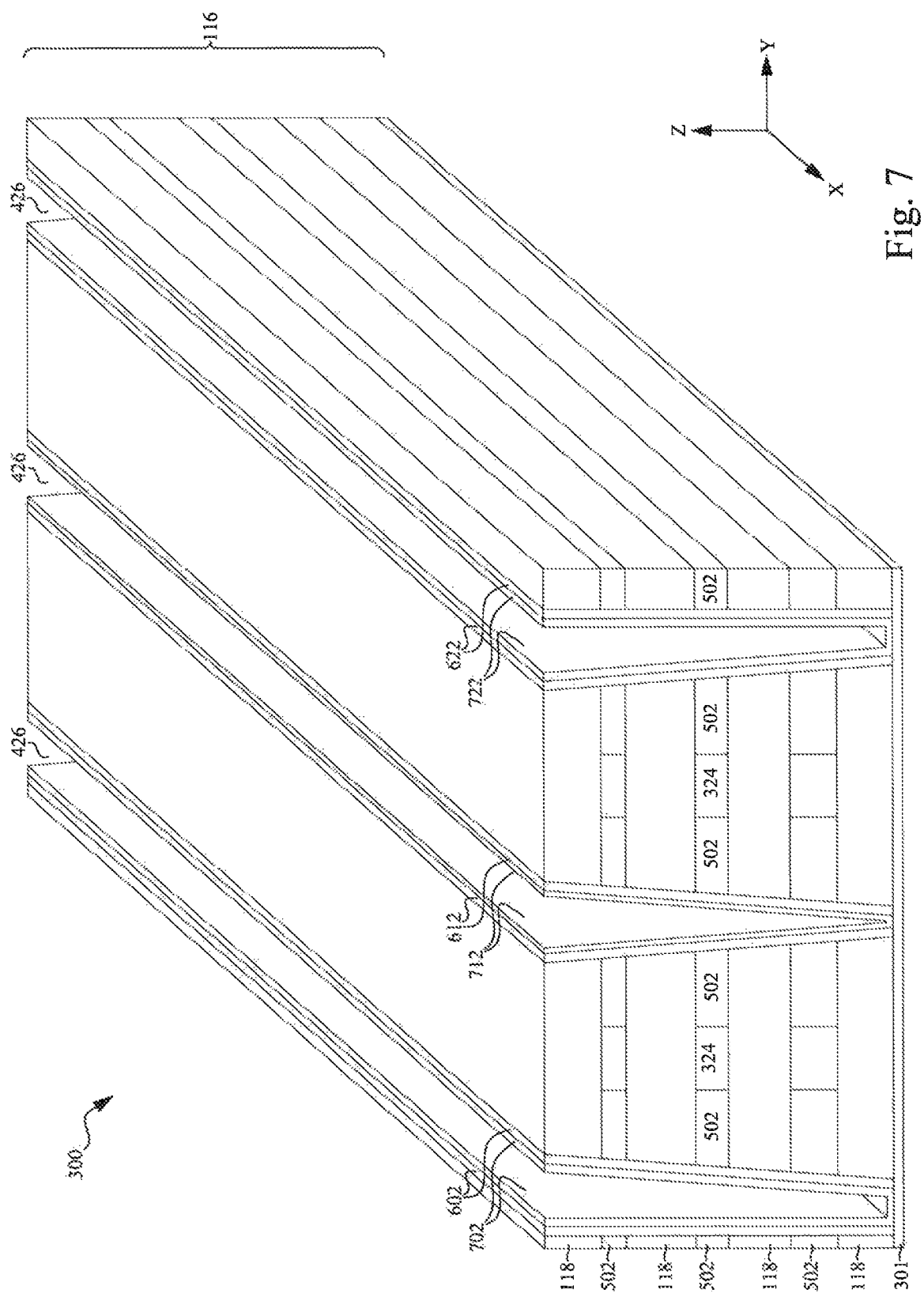

Corresponding to operations 214 of FIG. 2A, FIG. 7 is a perspective view of the semiconductor device 300 in which semiconductor channel layers 702, 712, and 722 are formed within each of the plurality of first trenches 426 on exposed surfaces of the memory layers 602, 612, and 622, respectively, such that the semiconductor channel layers 702-722 also continuously extends along the X-direction in accordance with some embodiments.

In some embodiments, the semiconductor channel layers 702-722 may be formed from a semiconductor material, for example, silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. The semiconductor channel layers 702-722 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the semiconductor channel layers 702-722 are continuous on the inner surface of the memory layers 602-622, respectively. In some embodiments, a CMP operation may be performed after forming the semiconductor channel layers 702-722 so that they will lie in the same X-Y plane or are level with a top surface of the topmost insulating layer 118.

Figure 8:
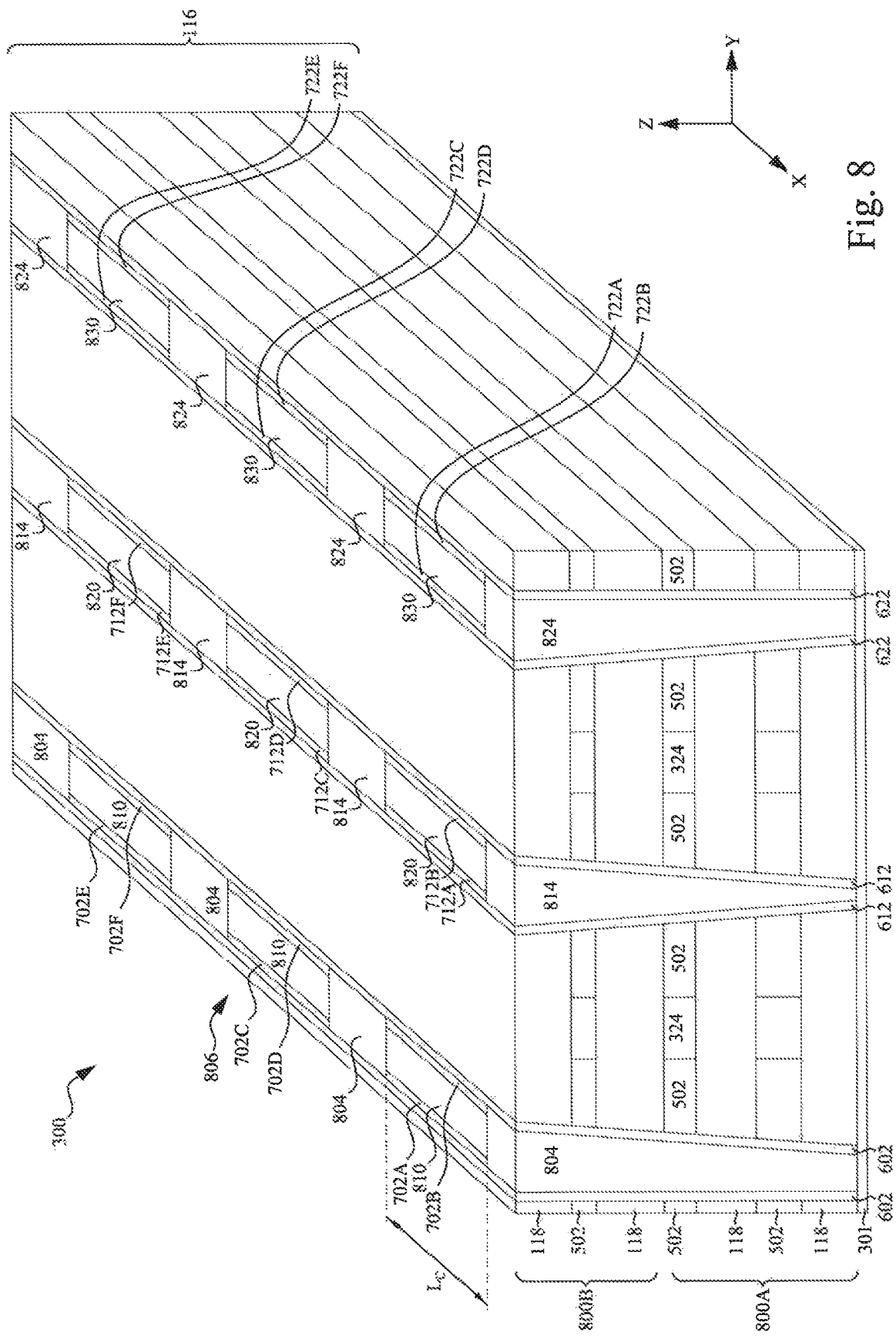

Corresponding to operations 216-220 of FIGS. 2A-B, FIG. 8 is a perspective view of the semiconductor device 300 in which the semiconductor channel layers 702-722 are cut along the X-direction to form semiconductor channels 702A-F, 712A-F, and 722A-F, respectively, and insulation layers are formed within each of the plurality of trenches, in accordance with some embodiments.

Corresponding to operation 216, the semiconductor channel layers 702-722 are patterned by, for example, an anisotropic etching process to form a number of portions. Other methods of patterning the semiconductor channel layers 702-722 are within the scope of the present disclosure. The semiconductor channel layer 702 is patterned to form a number of channel segments 702A, 702B, 702C, 702D, 702E, and 702F. The semiconductor channel layer 712 is patterned to form a number of channel segments 712A, 712B, 712C, 712D, 712E, and 712F. The channel layer 722 is patterned to form a number of channel segments 722A, 722B, 722C, 722D, 722E, and 722F. In various embodiments, each of the channel segments 702A-F, 712A-F, and 722A-F may extend along the X-direction with a length ($L_C$), which may be configured to define the physical channel length of a memory cell.

Corresponding to operation 220, insulation layers are formed within each of the plurality of trenches by filling each of the plurality of trenches with an insulating material such that a plurality of first device segments that include the memory layers 602-622, the semiconductor channels 702A-722F, and the insulation layers are formed in the semiconductor device, and extend in the first direction parallel to each other. The insulation layers form isolation structures 804, 814, and 824 as well as inner spacers 810, 829, and 830.

Each of the trenches is filled with an insulating material (e.g., SiO$_2$, SiN, SiON, SiCN, SiC, SiOC, SiOCN, the like, any other suitable material, or combinations thereof) so as to form the insulation layer. In some embodiments, the insulation layers may be formed from the same material as the plurality of insulating layers 118 (e.g., SiO$_2$). The insulation layer may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof, a high aspect ratio process (HARP), another applicable process, or combinations thereof. Thus, a plurality of partially-formed memory cells 806 that include the memory layers 602-622, the semiconductor channels 702A-722F, and the insulation layers are formed in the semiconductor device 300, and extend in the X-direction parallel to each other.

The cavities filled with the insulation layer in between the partially-formed memory cells 806 form the isolation structures 804, 814, and 824. The isolation structures 804-824 separate the semiconductor channels 702A-722F into portions such that the semiconductor channels 702A-722F are included in each memory cells 806.

As shown in FIG. 8, each partially-formed memory cell 806 includes an inner spacer 810, 820, or 830 formed from a portion of the insulation layer extending between adjacent isolation structures 804-824 in the X-direction, in accordance with some embodiments. The semiconductor channels 702A-722F are disposed on outer surfaces of the inner spacers 810-830 in the X-direction. Corresponding to operation 220, a CMP process may then be performed after forming the insulation layer so that it will lie in the same X-Y plane or are level with a top surface of the topmost insulating layer 118. In some embodiments, the thickness of the word lines 502 can increase along an increased height of a first portion 800A and a second portion 800B. In some embodiments, the thickness of the word lines 502 can increase along the first portion 800A and decrease along the second portion 800B. In some embodiments, the thickness of the word line 502 can decrease along the first portion 800A and increase along the second portion 800B.

Figure 9:
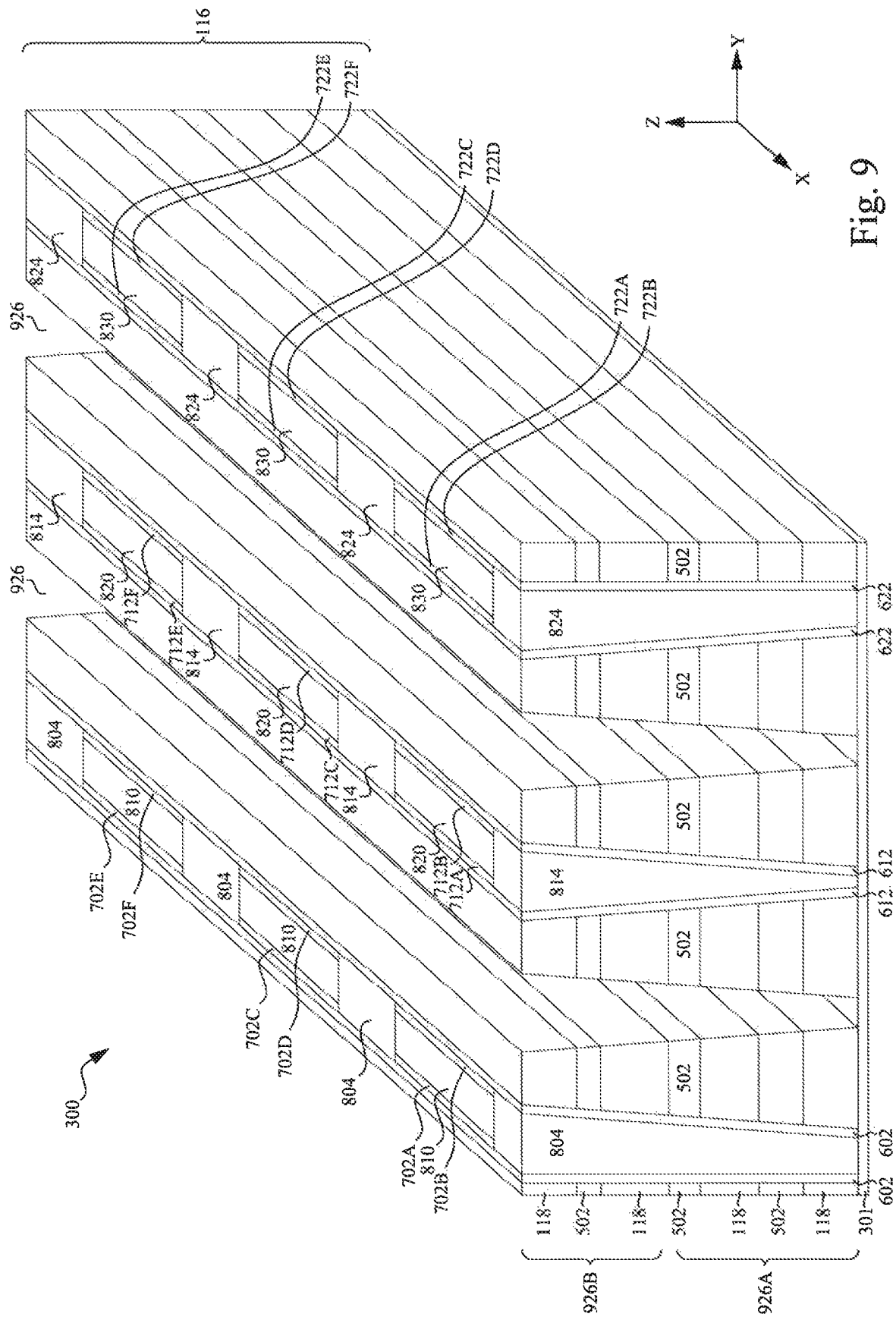

Corresponding to operations 222-226 of FIG. 2B, FIG. 9 is a perspective view of the semiconductor device 300 in which a plurality of second trenches 926 are formed between each of the first device segments such that the plurality of second trenches 926 also continuously extends in the X-direction, and the remaining portions of the sacrificial layers 324 are etched to form a second set of word lines 502, in accordance with some embodiments.

As with the first trenches 426, the second trenches 926 are formed by etching the stack 116 in the Z-direction to the substrate 301. FIG. 9 depicts that two second trenches 926 are formed, but it is understood that any number of second trenches can be formed (e.g., 2, 3, 4, 5, 6, 7, 8, 9, or 10 trenches). In some embodiments, the number of second trenches formed may be one less than the number of first trenches.

The plurality of second trenches 926 may be formed using the same process used to form the first plurality of first trenches 426. For example, the second trenches 926 may be formed, for example, by depositing a photoresist or other masking layer on a top surface of the semiconductor device 300, i.e., the top surface of the topmost insulating layer 118 of the stack 116, and a pattern corresponding to the second trenches 926 defined in the masking layer (e.g., via photolithography, e-beam lithography, or any other suitable lithographic process). In other embodiments, a hard mask may be used. Subsequently, semiconductor device 300 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 926. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

As shown in FIG. 9, the etch used to form the plurality of second trenches 926 etches through each of the sacrificial layers 324 and insulating layers 118 of the stack 116 such that each of the plurality of second trenches 926 extend form the topmost insulating layer 118 through the bottommost insulating layer 118 to the substrate 301. In some embodiments, the second trenches 926 may be etched with an increasing width as the height of second trenches 926 increases the Z-direction, as shown in FIG. 9. In some embodiments, the upper portion of the second trenches 926 may be exposed to more etchants in order to create the varying width.

In some embodiments, the second trenches 926 may have a first portion 926A and a second portion 926B along the Z-direction. In some embodiments, the width of the second trenches 926 may decrease along the first portion 926A and increase along the second portion 926B with an increasing height along the Z-direction. In some embodiments, the width of the second trenches 926 may increase along the first portion 926A and decrease along the second portion 926B with an increasing height along the Z-direction.

Corresponding to operation 224, the remaining portions of the sacrificial layers 324 are removed so as to form cavities between the insulating layers 118 adjacent to the previously formed word lines 502 (not shown). A second set of adhesive layers are optionally formed and word lines 502 are formed adjacent to the previously formed word lines 502. FIG. 9 is a perspective view of the semiconductor device 300 after forming a second set of word lines 502 adjacent to the previously formed word lines 502. The remaining portions of the sacrificial layers 324 may be etched using the same process as described by etching exposed portions of the sacrificial layers 324 in the second trenches 926 until the sacrificial layers 324 are completely removed. This leaves cavities between adjacent layers of insulating layers 118 and adjacent to the word lines 502. Optionally, an adhesive layer is deposited on walls of the newly formed cavities.

Corresponding to operation 226, a word line 502 material is then deposited in the cavities so as to fill the cavities to form a second set of word lines 502 adjacent to the previously formed word lines 502 such that the two word lines 502 are disposed next to each other with the adhesive layer disposed therebetween. The word lines 502 may inherit the varying thicknesses of the sacrificial layers 324. In some embodiments, the bottommost word line 502 may have a larger thickness than the topmost word line 502, as shown in FIG. 5. In such embodiments, the word lines 502 in between the bottommost word line 502 and the topmost word line 502 may have a decreasing thickness along the Z-direction. The thicker word lines 502 provide a larger contact area with a later-formed semiconductor channel which allows more current to travel between the semiconductor channel and the word lines 502. The thickness of the word line 502 may provide the desired cell current to a memory cell (described later). As shown in Equation 1 above, the cell current is positively proportional to its channel width (e.g., the thicknesses of the word lines 502.)

In some embodiments, the thickness of the word lines 502 formed increases along the first portion 926A and decreases along the second portion 926B. In some embodiments, the thickness of the word line 502 decreases along the first portion 926A and increases along the second portion 926B.

The word lines 502 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The word lines 502 can be formed by overlaying the workpiece with the above-listed metal material by, for example, chemical vapor deposition (CVD), physical vapor deposition (PVD), electroless plating, electroplating, any other suitable process, or combinations thereof.

Although each word line 502 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ (sometimes referred to as $V_{th}$) is achieved in the device that is to be formed. The work function layer(s) may be deposited by CVD, physical vapor deposition (PVD), ALD, and/or other suitable processes.

Formation of the word lines 502 in the cavities may cause edges of the word lines 502 in the Y-direction to protrude outwards of the cavities, i.e., outwards of the corresponding edges of the insulating layers 118, and/or the material forming the word lines 502 may also be deposited on exposed surfaces of the insulating layers 118 that face the second trenches 926 and/or the substrate 301. The protruding edges of the word lines 502 are etched, for example, using a selective wet etching or dry etching process (e.g., RIE, DRIE, etc.) until any gate material deposited on the surfaces of the insulating layers 118 and/or the substrate 301, and edges of the word lines 502 facing the second trenches 926 are substantially axially aligned with corresponding edges of the insulating layers 118.

Figure 10:
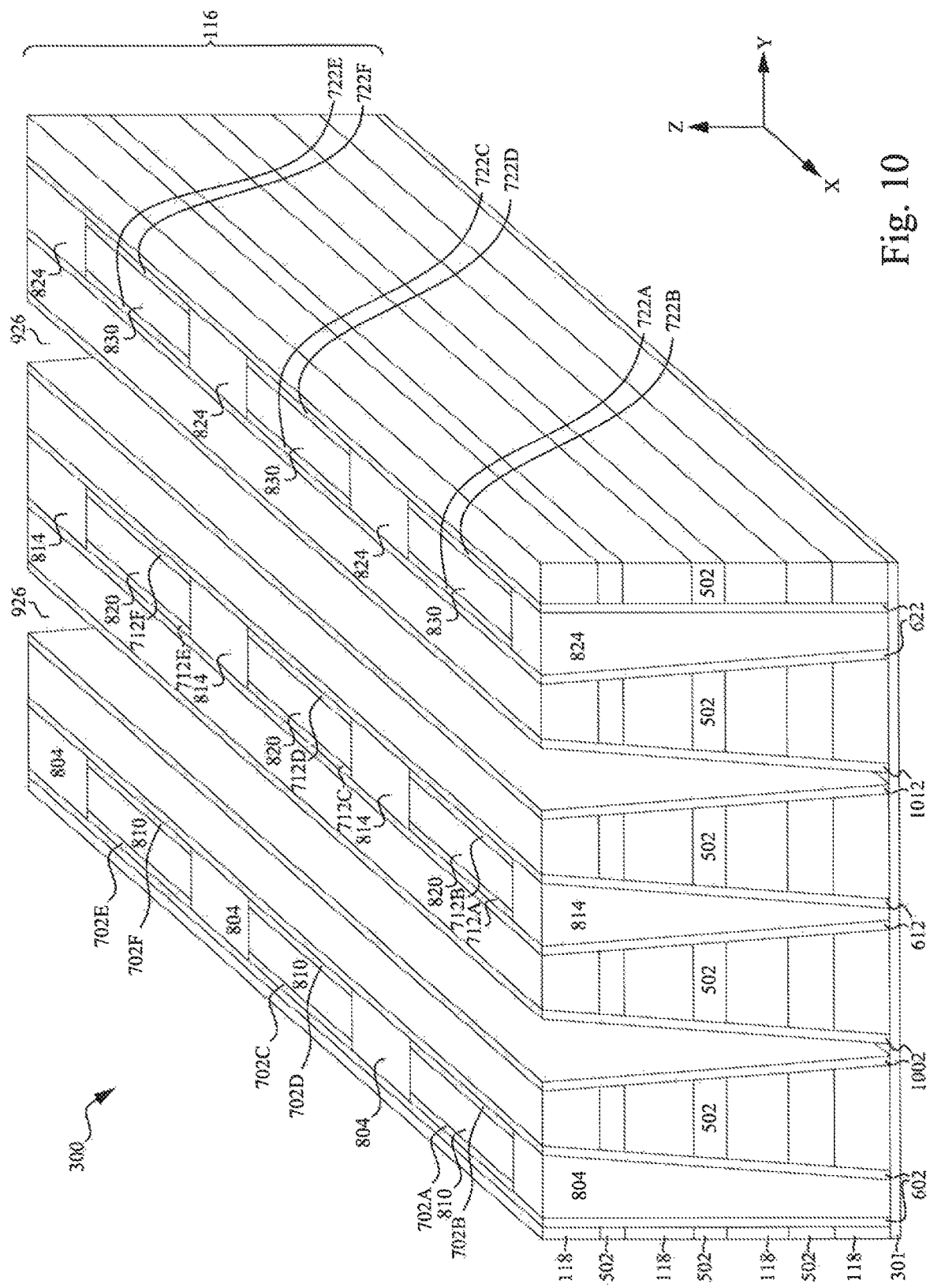

Corresponding to operation 228 of FIG. 2B, FIG. 10 is a perspective view of the semiconductor device 300 in which a second set of memory layers 1002 and 1012 is formed in each of the second trenches 926 on exposed surfaces of the insulating layers 118 and the word lines 502 located in the second trenches 926, such that the memory layers 1002 and 1012 continuously extend along the X-direction, in accordance with some embodiments.

The second set of memory layers 1002 and 1012 are substantially similar to the memory layers 602-622. The memory layers 1002 and 1012 may include a ferroelectric material, for example, lead zirconate titanate (PZT), $PbZr/TiO_3$, $BaTiO_3$, $PbTiO_2$, etc. However, it should be understood that the memory layers 1002 and 1012 can include any of various other materials that are suitable as in memory devices, while remaining within the scope of the present disclosure. For example, the memory layers 1002 and 1012 can include a material selected from the group consisting of: $HfO_2$, $Hr_{1-x}Zr_xO_2$, $ZrO_2$, $TiO_2$, NiO, $TaO_x$, $Cu_2O$, $Nb_2O_5$, $AlO_x$, and combinations thereof. The memory layers 1002 and 1012 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the memory layers 1002 and 1012 are continuous on the walls of the second trenches 926. In some embodiments, a CMP operation may be performed after forming the memory layers 1002 and 1012 so that they will lie in the same X-Y plane or are level with a top surface of the topmost insulating layer 118. After formation, memory layers 1002 and 1012 are sometimes referred to as memory films.

Figure 11:
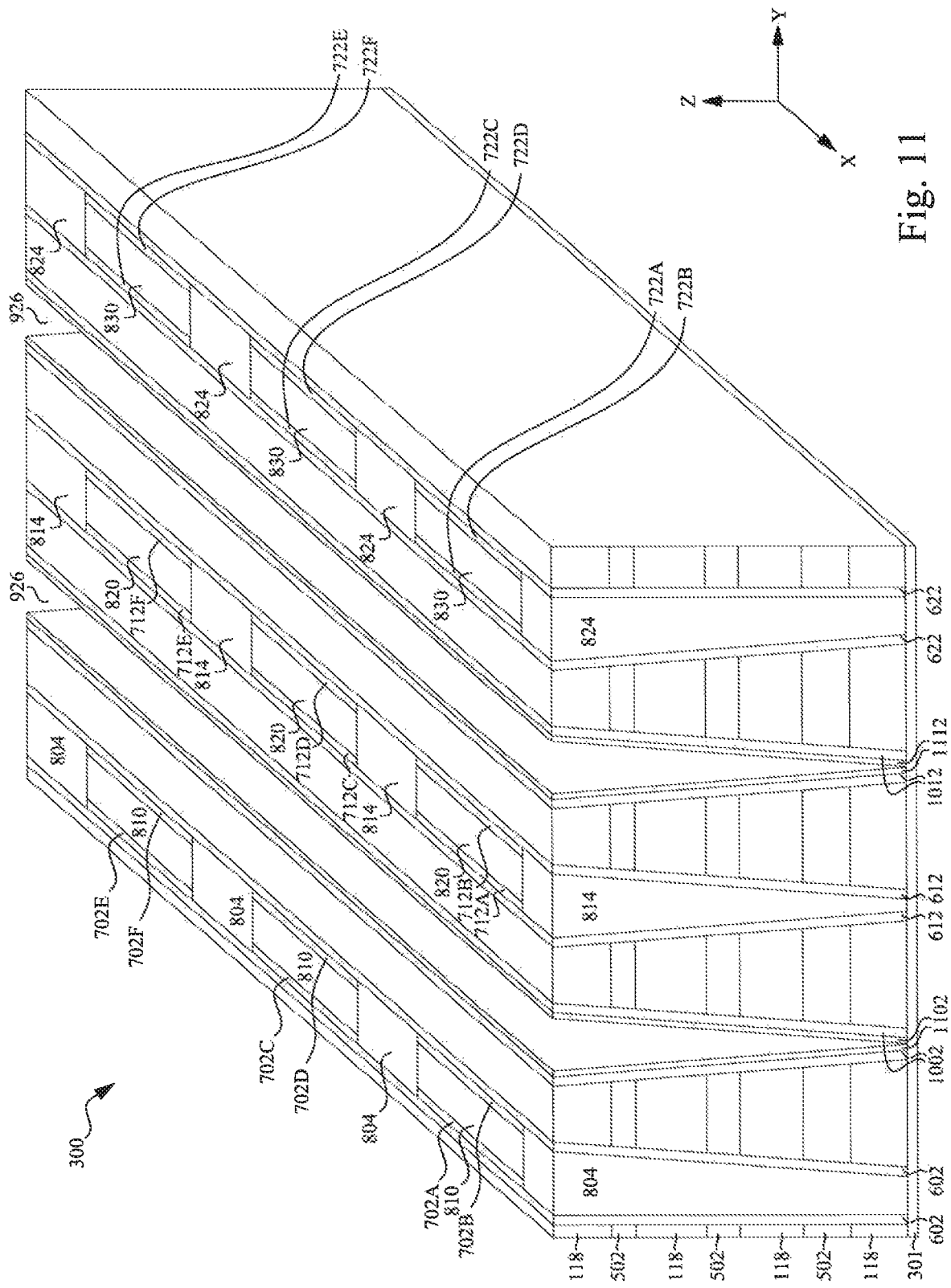

Corresponding to operation 230 of FIG. 2B, FIG. 11 is a perspective view of the semiconductor device 300 in which a second set of semiconductor channel layers 1102 and 1112 are formed within each of the plurality of second trenches 926 on exposed surfaces of the memory layers 1002 and 1012, respectively, such that the semiconductor channel layers 1102 and 1112 also continuously extend along the X-direction, in accordance with some embodiments.

The second set of semiconductor channel layers 1102 and 1112 are substantially similar to the semiconductor channel layers 702, 712, and 722. In some embodiments, the semiconductor channel layers 1102 and 1112 may be formed from a semiconductor material, for example, silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. The semiconductor channel layers 1102 and 1112 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the semiconductor channel layers 1102 and 1112 are continuous on the inner surface of the memory layers 1002 and 1012, respectively. In some embodiments, a CMP operation may be performed after forming the semiconductor channel layers 1102 and 1112 so that they will lie in the same X-Y plane or are level with a top surface of the topmost insulating layer 118.

Figure 12:
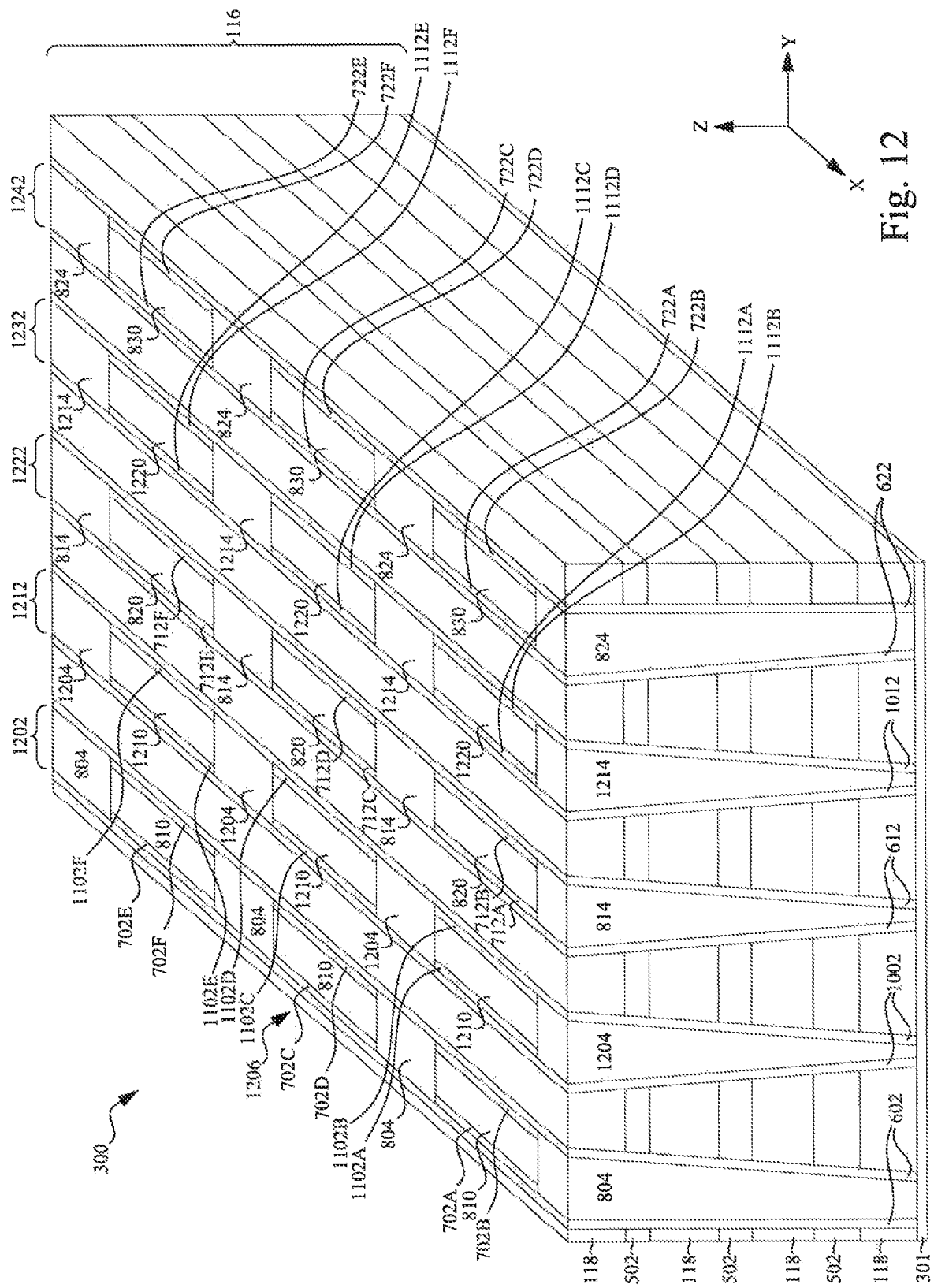

Corresponding to operation 232, FIG. 12 is a perspective view of the semiconductor device 300 in which the semiconductor channel layers 1102 and 1112 are cut along the X-direction to form a semiconductor channel segments 1102A-F and 1112A-F, respectively, and insulation layers are formed within each of the plurality of trenches, in accordance with some embodiments.

The semiconductor channel layers 1102 and 1112 are patterned by, for example, an anisotropic etching process to form a number of portions. Other methods of patterning the semiconductor channel layers 1102 and 1112 are within the scope of the present disclosure. The semiconductor channel layer 1102 is patterned to form a number of channel segments 1102A, 1102B, 1102C, 1102D, 1102E, and 1102F. The semiconductor channel layer 1112 is patterned to form a number of channel segments 1112A, 1112B, 1112C, 1112D, 1112E, and 1112F. In various embodiments, each of the channel segments 1102A-F and 1112A-F may extend along the X-direction with a length ($L_C$), which may be configured to define the physical channel length of a memory cell.

Then, insulation layers are formed within each of the plurality of trenches by filling each of the plurality of trenches with an insulating material such that a plurality of second device segments that include the memory layers 1002 and 1012, the semiconductor channels 1102A-1112F, and the insulation layers are formed in the semiconductor device, and extend in the X-direction parallel to each other. The insulation layers form isolation structures 1204 and 1214 as well as inner spacers 1210 and 1220.

Each of the trenches is filled with an insulating material (e.g., $SiO_2$, SiN, SiON, SiCN, SiC, SiOC, SiOCN, the like, any other suitable material, or combinations thereof) so as to form the insulation layer. In some embodiments, the insulation layer may be formed from the same material as the plurality of insulating layers 118 (e.g., $SiO_2$). The insulation layer may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of partially-formed memory cells 1206 that include the memory layers 1002 and 1012, the semiconductor channels 1102A-1112F, and the insulation layers are formed in the semiconductor device 300 and extend in the X-direction parallel to each other.

At operation 232, the cavities filled with the insulation layer in between the partially formed memory cells 1206 form the isolation structures 1204 and 1214. The isolation structures 1204 and 1214 separate the semiconductor channels 1102A-1112F into portions such that the semiconductor channels 1102A-1112F are included in each partially-formed memory cell 1206.

Each partially-formed memory cell 1206 includes an inner spacer 1210 or 1220 formed from a portion of the insulation layer extending between adjacent isolation structures 1204 or 1214 in the X-direction. The semiconductor channels 1102A-1112F are disposed on outer surfaces of the inner spacers 1210 or 1220 in the X-direction. A CMP process may then be performed after forming the insulation layer so that it will lie in the same X-Y plane or are level with a top surface of the topmost insulating layer 118.

FIG. 12 also illustrates second device segments 1212 and 1232 formed between the first device segments 1202, 1222, and 1242. Each of the second device segments 1212 and 1232 is similar in structure to the first device segments 1202, 1222, and 1242 and include the memory layers 1002 and 1012, the semiconductor channel layers 1102A-1112F, the isolation structures 1204 and 1214, and the inner spacers 1210 and 1220. The second device segments 1212 and 1232 extend in the X-direction parallel to each other with the first device segment 1222 interposed between a pair of second device segments 1212 and 1232. Forming the first and second device segments 1202-1242 allows adjacent insulating layers 118 in the stack 116 to always be supported by either the sacrificial layers 324 during formation of the word lines 502 included in the first device segments 1202, 1222, and 1242, or supported by the word lines 502 of the first device segments 1202, 1222, and 1242 during formation of the second device segments 1212 and 1232, while allowing increase in a device packing density of the semiconductor device 300.

Corresponding to operation 234 of FIG. 2B, FIGS. 13A-C are a perspective view of the semiconductor device 300, a top view, and a cross-section view cut along a first cross-section (e.g., along the X-direction), respectively, in accordance with some embodiments. As shown at least in FIG. 13A, the semiconductor device 300 includes a number of source lines 1306, 1310, 1314, 1318, 1322, 1326, 1330, 1334, 1338, 1342, 1346, 1350, 1354, 1358, and 1362 and a number of bit lines 1308, 1312, 1316, 1320, 1324, 1328, 1332, 1336, 1340, 1344, 1348, 1352, 1356, 1360, and 1364 that are formed to form memory cells. In some embodiments, a source line or bit line may sometimes be collectively referred to as a bit/source line. However, it should be understood that, in some embodiments, the source lines and bit lines may be coupled to different levels of (e.g., voltage) signals, when operating the semiconductor device.

The inner spacers 810, 820, 830, 1210, and 1220 may be patterned to define initial footprints of a number of source lines and bit lines. The patterning generates trench portions by first etching through axial ends of the inner spacers 810, 820, 830, 1210, and 1220 to the substrate 301. The axial ends of the inner spacers 810, 820, 830, 1210, and 1220 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 13A:
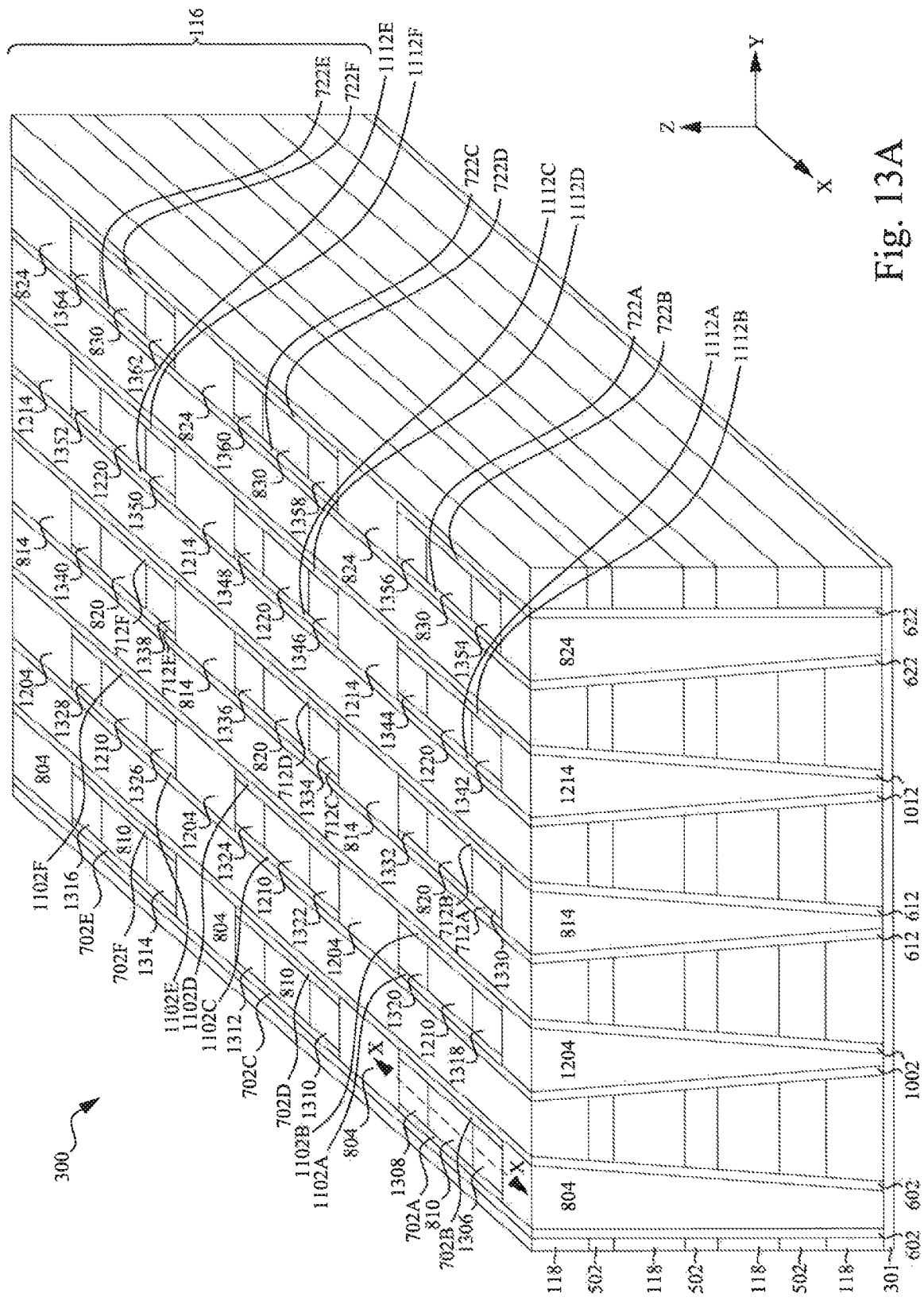

Next, the source lines 1306-1362 and the bit lines 1308-1364 may be formed, for example, using an epitaxial layer growth process to fill the trench portions with a metal material such that the source lines 1306-1362 and the bit lines 1308-1364 are located on opposite axial ends of the inner spacers 810-830 and 1210-1220, each extending from the substrate 301 to a top surface of the inner spacers 810-830 and 1210-1220, as shown in FIG. 13A. The source lines 1306-1362 and the bit lines 1308-1364 may be formed in contact with end portions of a sidewall of the semiconductor channels 702A-F, 712A-F, 722A-F, 1202A-F, and 1212A-F. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure.

The source lines 1306-1362 and bit lines 1308-1364 can be formed by overlaying the workpiece (e.g., to fill the recesses) with the above-listed metal material by, for example, chemical vapor deposition (CVD), physical vapor deposition (PVD), electroless plating, electroplating, any other suitable method, or combinations thereof. In some embodiments, a control deposition step may be performed for forming the source lines 1306-1362 and the bit lines 1308-1364 such that the deposition step is stopped when a height of the source lines 1306-1362 and the bit lines 1308-1364 in the Z-direction are equal to a height of the stack 116. In other embodiments, a CMP operation may be performed after formation of the source lines 1306-1362 and the bit lines 1308-1364 so as to ensure a top surface of each of the topmost insulating layer 118, the memory layers 602, 612, 622, 1002, and 1012, the semiconductor channels 702A-722F and 1102A-1112F, the inner spacers 810-830 and 1210-1220, the source lines 1306-1362, and the bit lines 1308-1364 lie in the same X-Y plane or are level with a top surface of the topmost insulating layer 118. In other embodiments, a top surface of the source lines 1306-1362 and the bit lines 1308-1364 may be higher than a top surface of the topmost insulating layer 118. In some other embodiments, the top surface of the source lines 1306-1362 and the bit lines 1308-1364 may be lower than the top surface of the topmost insulating layer 118.

Figure 13C:
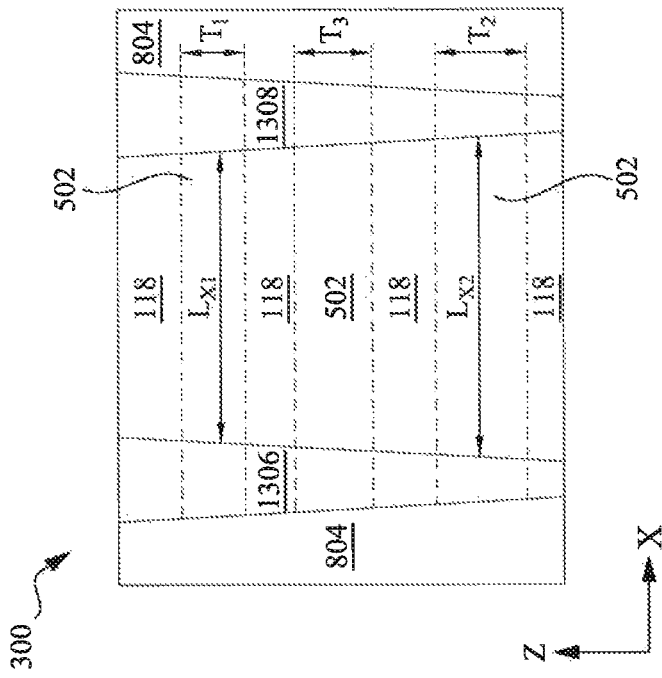
FIGS. 13B and 13C illustrate a top view and a cross-sectional view cut along a first lateral cross-section (e.g., along the X-direction), respectively, of the example semiconductor device, in accordance with some embodiments.
Figure 13B:
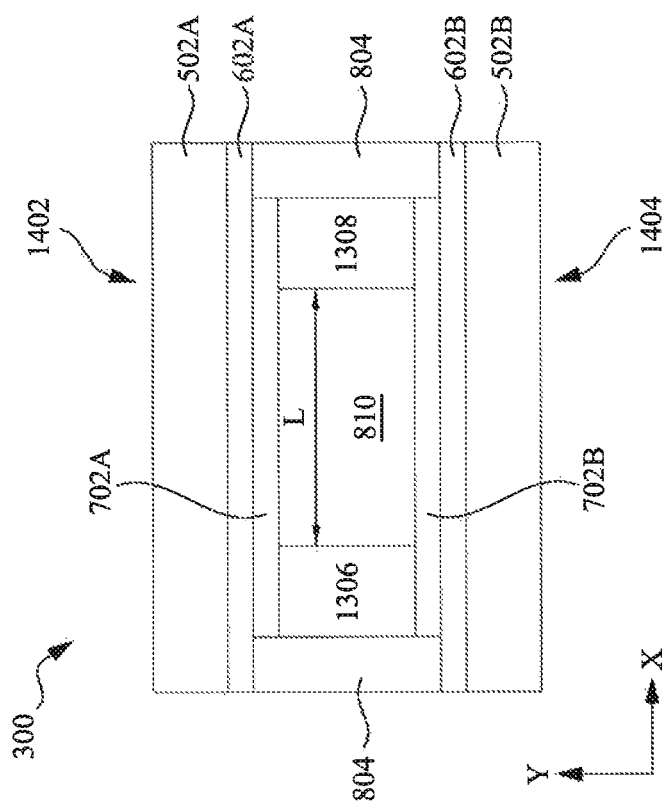

FIG. 13B is the top view of two memory cells 1402 and 1404, each of which may be comprised of one word line, one source line, one bit line, a portion of a semiconductor channel, and a portion of a memory layer.

The memory cell 1402 is one memory cell from the semiconductor device 300 and comprises a portion of the word line 502A, the source line 1306, the bit line 1308, a portion of the semiconductor channel 702A, and a portion of the memory layer 602A. The memory cell 1404 is another memory cell from the semiconductor device 300 and comprises a portion of the word line 502B, the source line 1306, the bit line 1308, a portion of the semiconductor channel 702B, and a portion of the memory layer 602B. A plurality of memory cells arranged along the Z-direction can form a memory string. In some embodiments, the plurality of memory cells in the memory string conduct a current with a constant level. L is defined as the length of the inner spacer 810 in the between the source line 1306 and the bit line 1308 in the X-direction. It is understood that semiconductor devices are not limited to the number of memory cells shown on semiconductor device 300.

FIG. 13C is a cross-section view of the semiconductor device 300 that illustrates the source line 1306 and the bit line 1308 and the alternating word lines 502 and insulating layers 118 taken across the cross-section X-X along the X-direction in FIG. 13A. Multiple memory cells such as but not limited to 1402 and 1404 can form respective channel lengths of memory cells arranged along a vertical direction (which are sometimes referred to as a memory string).

The dotted lines illustrate that the alternating word lines 502 and the insulating layers 118 are in a plane behind the source line 1306 and the bit line 1308. For the purposes of clarity, the source line 1306, the bit line 1308, and the word lines 502 are depicted in the same plane. As shown in FIG. 13C, the source line 1306 and the bit line 1308 extend vertically along the Z-direction. The source line 1306 and the bit line 1308 are spaced apart from each other along the X-direction. A plurality of word lines 502 alternating with insulating layers 118 extend along the X-direction and are disposed across the source line 1306 and the bit line 1308. The source line 1306 and the bit line 1308 may have an increasing varying width along an increasing height in the Z-direction. The varying width of the source line 1306 and the bit line 1308 result in a varying channel length in the memory string. For example, the topmost channel length is $Lx_1$, and the bottommost channel length is $Lx_2$. In some embodiments, the channel length $Lx_1$ may be less than the channel length $Lx_2$. In such embodiments, the channel lengths between the bottommost channel length $Lx_2$ and the topmost channel length $Lx_1$ decrease in length along an increasing height in the Z-direction.

In such embodiments, the thickness of the word lines 502 decreases with an increasing height along the Z-direction, corresponding to the channel lengths of the word lines 502. In some embodiments, the topmost word line 502 corresponding to the channel length $Lx_1$ has a word line thickness $T_1$. The bottommost word line 502 corresponding to the channel length $Lx_2$ has a word line thickness $T_2$. In some embodiments, the word line thickness $T_1$ is less than the word line thickness $T_2$ because the channel length $Lx_1$ is less than the channel length $Lx_2$. In some embodiments, the word line(s) 502 in between the bottommost word line 502 and the topmost word line 502 have a word line thickness $T_3$, and $T_3$ may be in between $T_1$ and $T_2$. In some embodiments, the thickness of the word lines 502 decrease between the bottommost word line 502 to the topmost word line 502 along an increasing height in the Z-direction. The varying thicknesses of the word lines 502 are designed to make cell current increase with increasing channel lengths such as $Lx_1$ and $Lx_2$ and to provide a constant cell current throughout the memory cells.

Figure 14A:
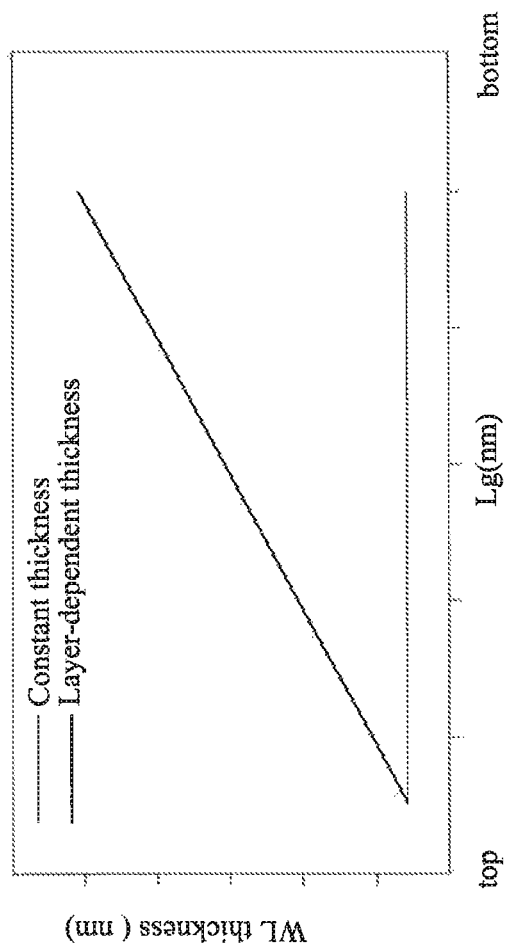
FIGS. 14A-C are plots of word line thickness versus channel length, cell current versus channel length, and cell current versus channel length, respectively, of the example semiconductor device of FIGS. 13A-C, in accordance with some embodiments.
Figure 14B:
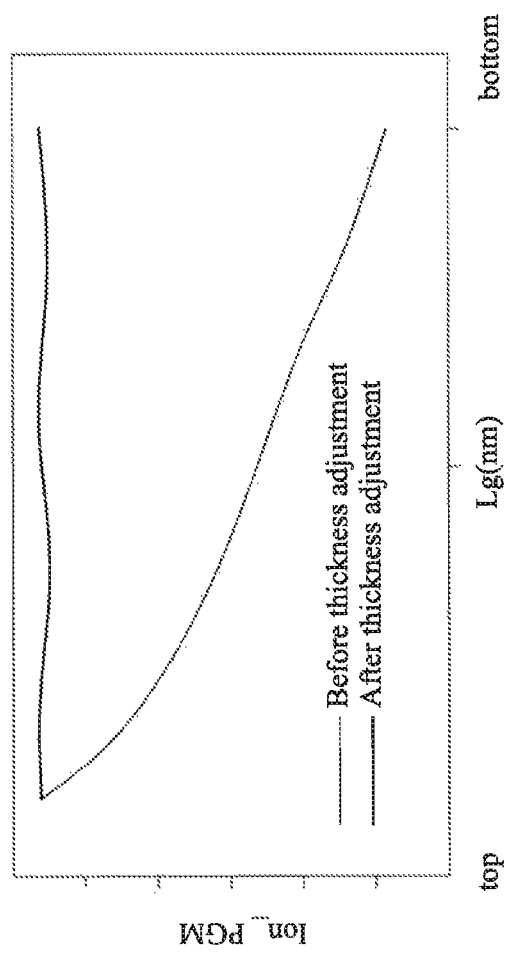
Figure 14C:
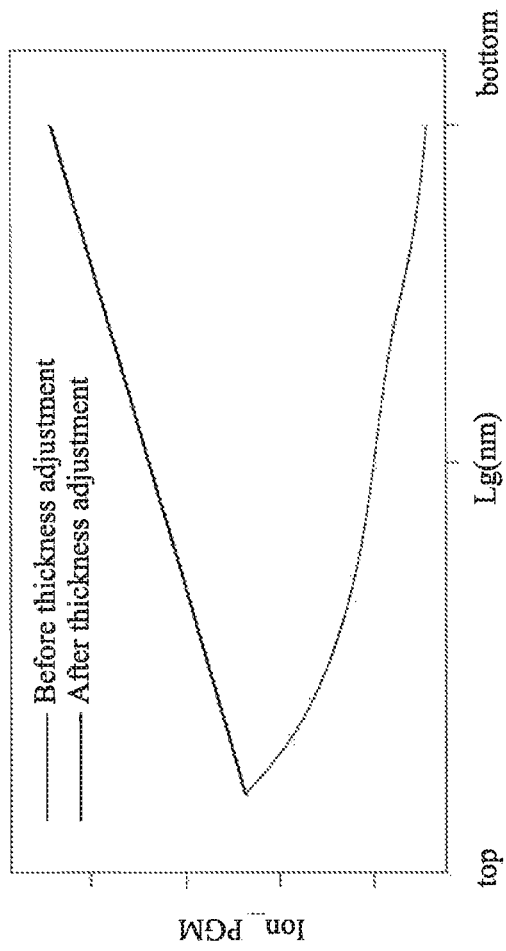

FIGS. 14A-C illustrate plots of word line thickness, cell current, and cell current, respectively, along the vertical axes that correspond to the embodiment of the semiconductor device 300 shown in FIGS. 13A-C. The horizontal axes of FIGS. 14A-C are channel length of the semiconductor device 300 from the top of the device to the bottom.

In the semiconductor device 300, the channel length increases from the top to the bottom. FIG. 14A illustrates that the word line thickness shown on the vertical axis directly corresponds to the channel length for this embodiment, in comparison to constant word line thickness of semiconductor channel typically observed in this field. From top to bottom, the channel length increases, and the word line thickness increases accordingly. FIG. 14B demonstrates that the varying word line thicknesses results in a constant cell current, in comparison to the degradation of cell current shown on the vertical axis typically observed along longer channel lengths. It is shown in FIG. 14B that increasing the word line thickness with an increasing channel length results in the desired cell current. FIG. 14C demonstrates another embodiment in which the varying word line thicknesses can be modified in order to result in an increasing cell current shown on the vertical axis instead of the degradation of cell current typically observed along longer channel lengths. FIG. 14C demonstrates that modifying the word line thickness of the semiconductor device 300 can result in any desired cell current.

Figure 15:
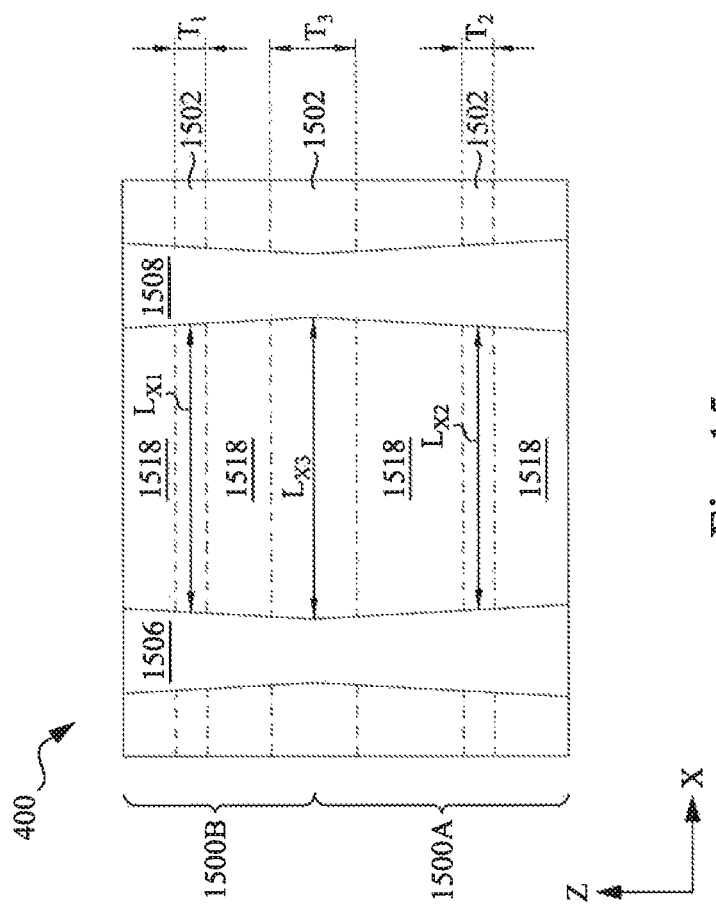
FIG. 15 illustrates a cross-sectional view cut along a first lateral cross-section (e.g., along the X-direction) of an example semiconductor device, in accordance with some embodiments.

FIG. 15 is a cross-section view of a semiconductor device 400 with a source line 1506 and a bit line 1508 that have varying widths that decrease in a first portion 1500A and increase in a second portion 1500B with an increasing height along the vertical direction (e.g., the Z-direction), cut along the X-direction, in accordance with some embodiments.

The semiconductor device 400 is formed from the method 200 from FIGS. 2A-B. The semiconductor device 400 is substantially similar to the semiconductor device 300 but with a decreasing varying width of the bit lines and the source lines in a first portion 1500A and an increasing varying width of the bit lines and source lines in a second portion 1500B along an increasing height of the semiconductor device 400 along the Z-direction. In contrast, the semiconductor device 300 has a continuously increasing varying width of the bit lines and the source lines along an increasing height of the semiconductor device 300.

The semiconductor device 400 comprises the source line 1506, the bit line 1508, and a plurality of alternating word lines 1502 and insulating layers 1518 which are substantially similar to the source line 1306, the bit line 1308, and the plurality of alternating word lines 502 and insulating layers 118 of the semiconductor device 300 in FIG. 13C, respectively. The dotted lines illustrate that the alternating word lines 1502 and the insulating layers 1518 are in a plane behind the source line 1506 and the bit line 1508. For the purposes of clarity, the source line 1506, the bit line 1508, and the word lines 1502 are depicted in the same plane. As shown in FIG. 15, the width of the source line 1506 and the bit line 1508 decrease with an increasing height along the first portion 1500A. The width of the source line 1506 and bit line 1508 increase with an increasing height along the second portion 1500B. The varying width of the source line 1506 and the bit line 1508 result in a varying channel length. For example, the topmost channel length is $Lx_1$, the bottommost channel length is $Lx_2$, and the channel length at the point where the first portion 1500A meets the second portion 1500B is $Lx_3$. In some embodiments, the channel length $Lx_3$ is greater than the channel lengths $Lx_1$ and $Lx_2$. In some embodiments, the channel length $Lx_1$ is equal to the channel length $Lx_2$. In some embodiments, the channel lengths between the bottommost channel length $Lx_2$ and the channel length $Lx_3$ increase in length in an increasing height along the Z-direction. In some embodiments, the channel lengths between the channel length $Lx_3$ and the topmost channel length $Lx_1$ decrease in length in an increasing height along the Z-direction.

The semiconductor device 400 further comprises memory layers and semiconductor channels corresponding to source line 1506 and the bit line 1508 (not shown). The memory layers and the semiconductor channels of the semiconductor device 400 are substantially similar to the memory layers 602-622 and 1002-1012 and the semiconductor channels 702A-722F and 1102A-1112F, respectively, in the semiconductor device 300.

In some embodiments, the thickness of the word lines 1502 increases along the first portion 1500A and decrease along the second portion 1500B with an increasing height in the Z-direction. The thickness of the word lines 1502 may be proportional to the channel length. For example, the topmost word line 1502 corresponding to the channel length $Lx_1$ has a word line thickness $T_1$. The bottommost word line 1502 corresponding to the channel length $Lx_2$ has a word line thickness $T_2$. The word line 1502 at the point where the first portion 1500A meets the second portion 1500B (sometimes referred to as a middle one of the plurality of third conductive structures) corresponding to the channel length $Lx_3$ has a word line thickness $T_3$. In some embodiments, $T_3$ is larger than both $T_2$ and $T_1$. In some embodiments, $T_1$ is equal to $T_2$. The varying thicknesses of the word lines 1502 are designed to make cell current increase or remain constant with varying channel lengths. In some embodiments, the plurality of memory cells in a memory string conduct a current with a constant level. It is understood that the semiconductor device 400 is not limited to the three word lines 1502 shown in FIG. 15, and that the middle one of the plurality of third conductive structures can refer to any word line 1502 between the topmost word line 1502 and the bottommost word line 1502.

Figure 16A:
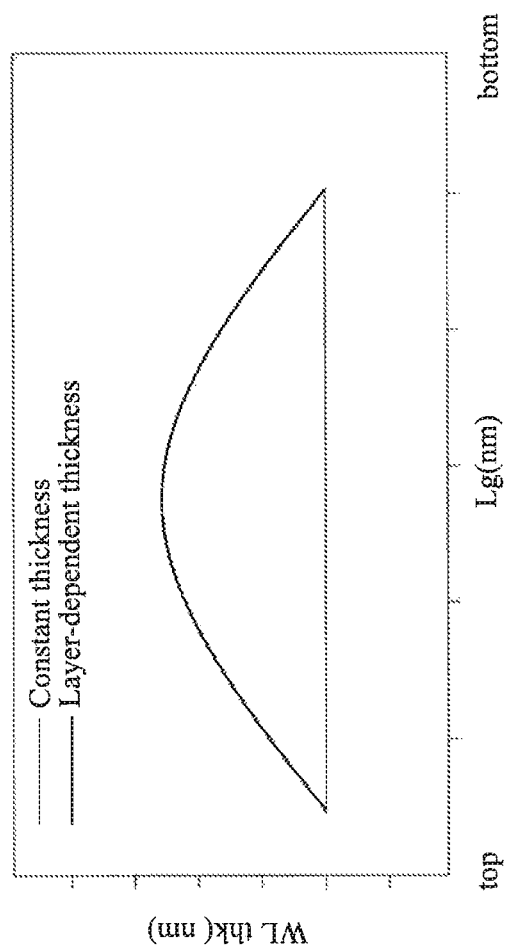
FIGS. 16A-B are plots of word line thickness versus channel length and a cell current versus channel length, respectively, of the example semiconductor device of FIG. 15, in accordance with some embodiments.
Figure 16B:
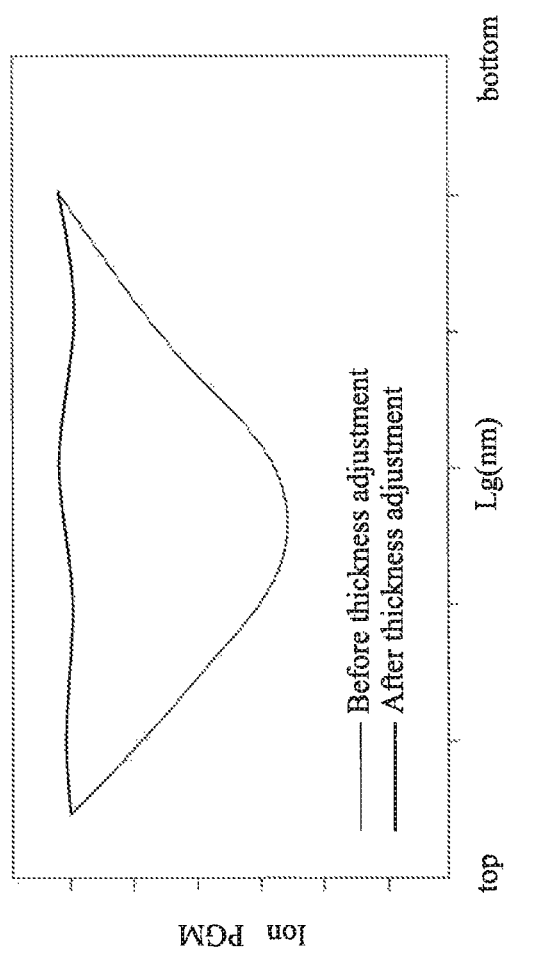

FIGS. 16A-B illustrate plots of word line thickness and cell current, respectively, along the vertical axes that correspond to the embodiment of the semiconductor device 400 shown in FIG. 15. The horizontal axes of FIGS. 16A-B are channel length of the semiconductor device 400 from the top of the device to the bottom.

In the semiconductor device 400, the channel length increases from the bottom along a first portion and decreases along a second portion to the top. FIG. 16A illustrates that the word line thickness shown on the vertical axis directly corresponds to the channel length for this embodiment, in comparison to constant word line thickness typically observed in this field. FIG. 16B demonstrates that the varying word line thickness results in a constant cell current shown on the vertical axis, in comparison to the degradation of cell current typically observed along longer channel lengths. It is shown in FIG. 16B that increasing the word line thickness with an increasing channel length results in the desired cell current.

Figure 17:
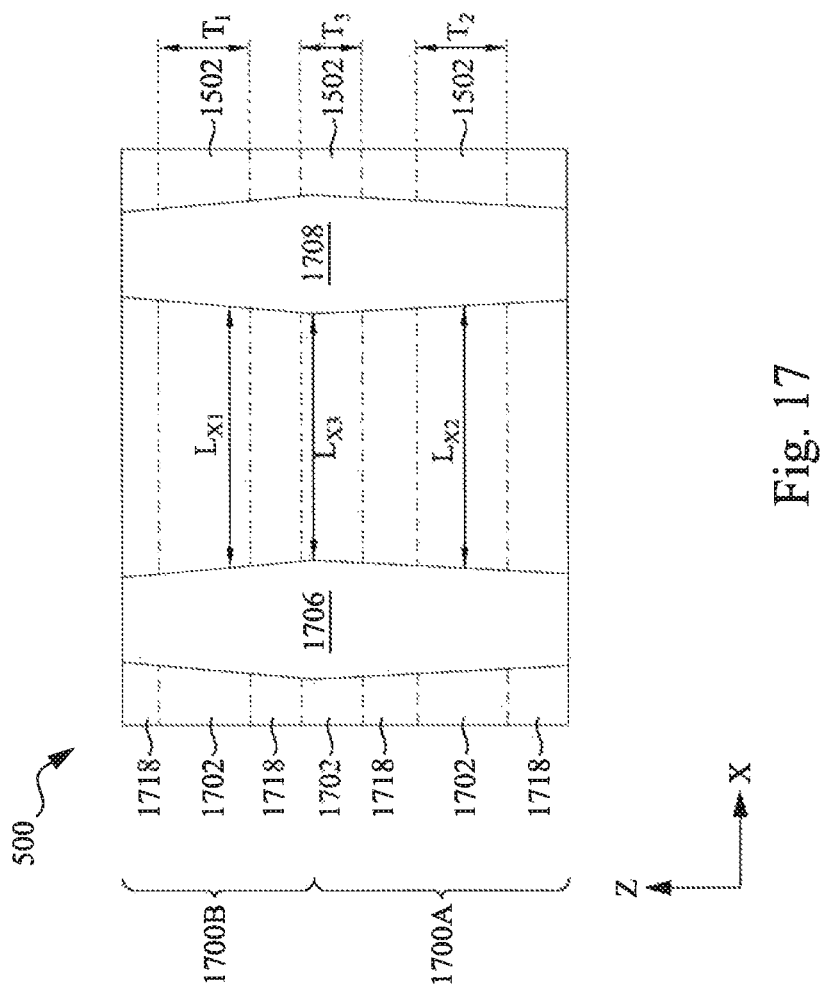
FIG. 17 illustrates a cross-sectional view cut along a first lateral cross-section (e.g., along the X-direction) of an example semiconductor device, in accordance with some embodiments.

FIG. 17 is a cross-section view of a semiconductor device 500 with a source line 1706 and a bit line 1708 that have varying widths that increases in a first portion 1700A and decreases in a second portion 1700B with an increasing height along the vertical direction (e.g., the Z-direction), cut along the X-direction, in accordance with some embodiments.

The semiconductor device 500 is formed from the method 200 from FIG. 2. The semiconductor device 500 is substantially similar to the semiconductor device 300 but with an increasing varying width of the bit lines and the source lines in a first portion 1700A and a decreasing varying width of the bit lines and source lines in a second portion 1700B along an increasing height of the semiconductor device 500 along the Z-direction. In contrast, the semiconductor device 300 has a continuously increasing varying width of the bit lines and the source lines along an increasing height of the semiconductor device 300.

The semiconductor device 500 comprises the source line 1706, the bit line 1708, and a plurality of alternating word lines 1702 and insulating layers 1718 which are substantially similar to the source line 1306, the bit line 1308, and the plurality of alternating word lines 502 and insulating layers 118 of the semiconductor device 300 in FIG. 13C, respectively. The dotted lines illustrate that the alternating word lines 1702 and the insulating layers 1718 are in a plane behind the source line 1706 and the bit line 1708. For the purposes of clarity, the source line 1706, the bit line 1708, and the word lines 1702 are depicted in the same plane. As shown in FIG. 17, the width of the source line 1706 and the bit line 1708 increase with an increasing height along the first portion 1700A. The width of the source line 1706 and bit line 1708 decrease with an increasing height along the second portion 1700B. The varying width of the source line 1706 and the bit line 1708 result in a varying channel length. For example, the topmost channel length is $Lx_1$, the bottommost channel length is $Lx_2$, and the channel length at the point where the first portion 1700A meets the second portion 1700B is $Lx_3$. In some embodiments, the channel length $Lx_3$ is less than the channel lengths $Lx_1$ and $Lx_2$. In some embodiments, the channel length $Lx_1$ is equal to the channel length $Lx_2$. In some embodiments, the channel lengths between the bottommost channel length $Lx_2$ and the channel length $Lx_3$ decrease in length in an increasing height along the Z-direction. In some embodiments, the channel lengths between the channel length $Lx_3$ and the topmost channel length $Lx_1$ increase in length in an increasing height along the Z-direction.

The semiconductor device 500 further comprises memory layers and semiconductor channels corresponding to source line 1706 and the bit line 1708 (not shown). The memory layers and the semiconductor channels of the semiconductor device 500 are substantially similar to the memory layers 602-622 and 1002-1012 and the semiconductor channels 702A-722F and 1102A-1112F, respectively, in the semiconductor device 300.

In some embodiments, the thickness of the word lines 1702 decrease along the first portion 1700A and increase along the second portion 1700B with an increasing height in the Z-direction. The thickness of the word lines 1702 may be proportional to the channel length. For example, the topmost word line 1702 corresponding to the channel length $Lx_1$ has a word line thickness $T_1$. The bottommost word line 1702 corresponding to the channel length $Lx_2$ has a word line thickness $T_2$. The word line 1702 at the point where the first portion 1700A meets the second portion 1700B (sometimes referred to as a middle one of the plurality of third conductive structures) corresponding to the channel length $Lx_3$ has a word line thickness $T_3$. In some embodiments, $T_3$ is less than both $T_2$ and $T_1$. In some embodiments, $T_1$ is equal to $T_2$. The varying thicknesses of the word lines 1702 are designed to make cell current increase or remain constant with varying channel lengths. In some embodiments, the plurality of memory cells in a memory string conduct a current with a constant level. It is understood that the semiconductor device 500 is not limited to the three word lines 1702 shown in FIG. 17, and that the middle one of the plurality of third conductive structures can refer to any word line 1702 between the topmost word line 1702 and the bottommost word line 1702.

Figure 18A:
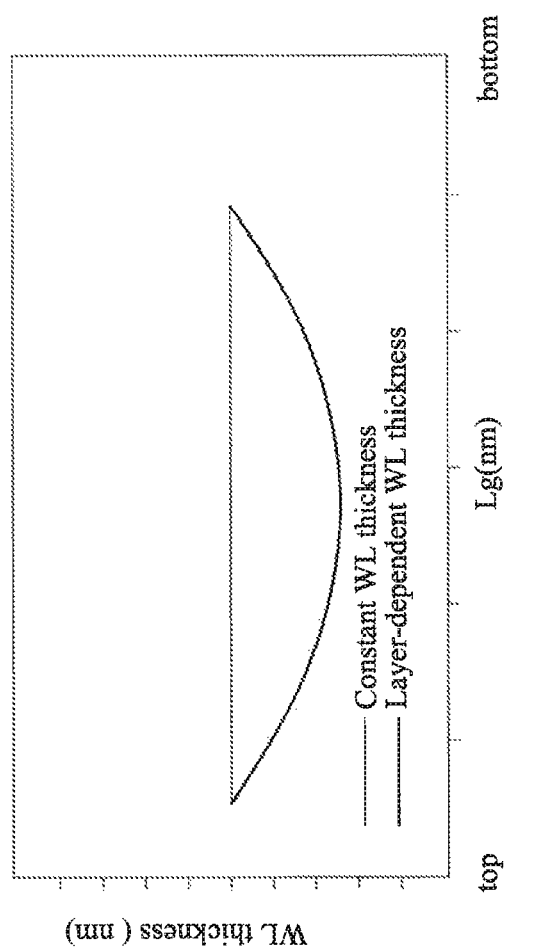
FIGS. 18A-B are plots of word line thickness versus a channel length and a cell current versus channel length, respectively, of the example semiconductor device of FIG. 14, in accordance with some embodiments.
Figure 18B:
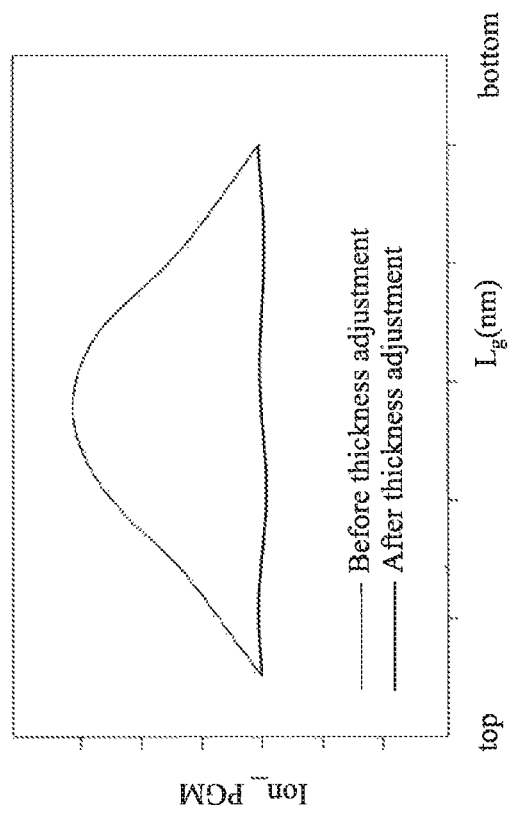

FIGS. 18A-B illustrate plots of word line thickness and cell current, respectively, along the vertical axes that correspond to the embodiment of the semiconductor device 500 shown in FIG. 17. The horizontal axes of FIGS. 18A-B are channel length of the semiconductor device 500 from the top of the device to the bottom.

In the semiconductor device 500, the channel length decreases from the bottom along a first portion and increases along a second portion to the top. FIG. 18A illustrates that the word line thickness shown on the vertical axis directly corresponds to the channel length for this embodiment, in comparison to the constant word line thickness typically observed in this field. FIG. 18B demonstrates that the word line thickness results in a constant cell current shown on the vertical axis, in comparison to the degradation of cell current typically observed along longer channel lengths. It is shown in FIG. 18B that increasing the word line thickness with an increasing channel length results in the desired cell current.

Figure 19A:
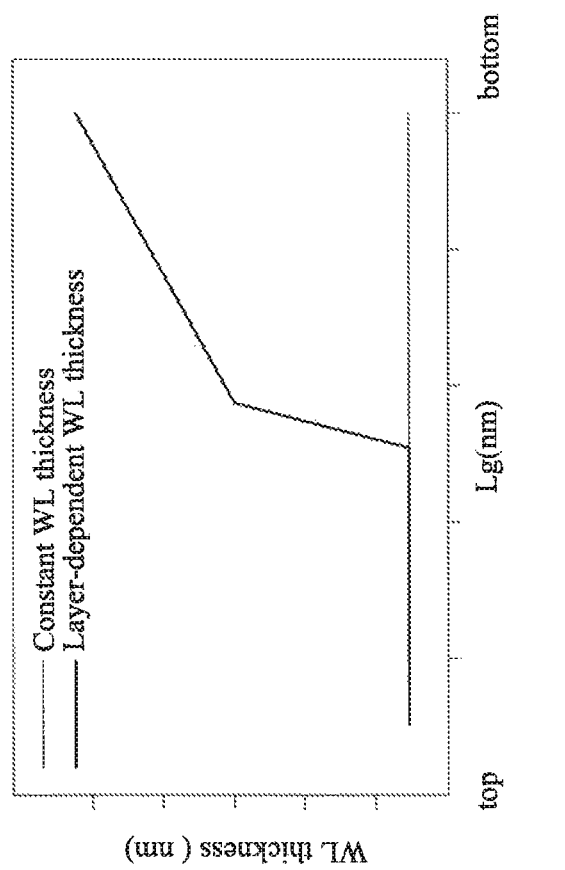
FIGS. 19A, 19B, 20A, 20B, 21A, and 21B are plots of word line thickness versus channel length and a cell current versus channel length of example semiconductor devices, in accordance with some embodiments.
Figure 19B:
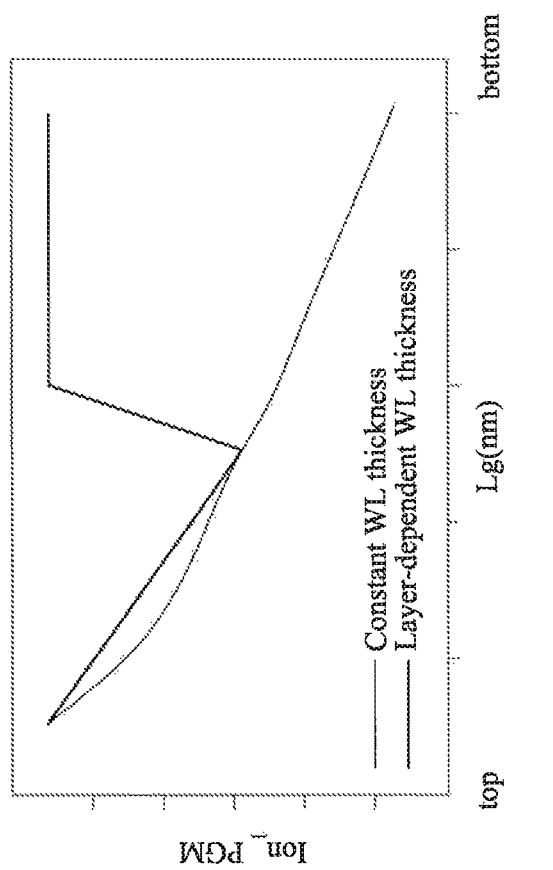
Figure 20A:
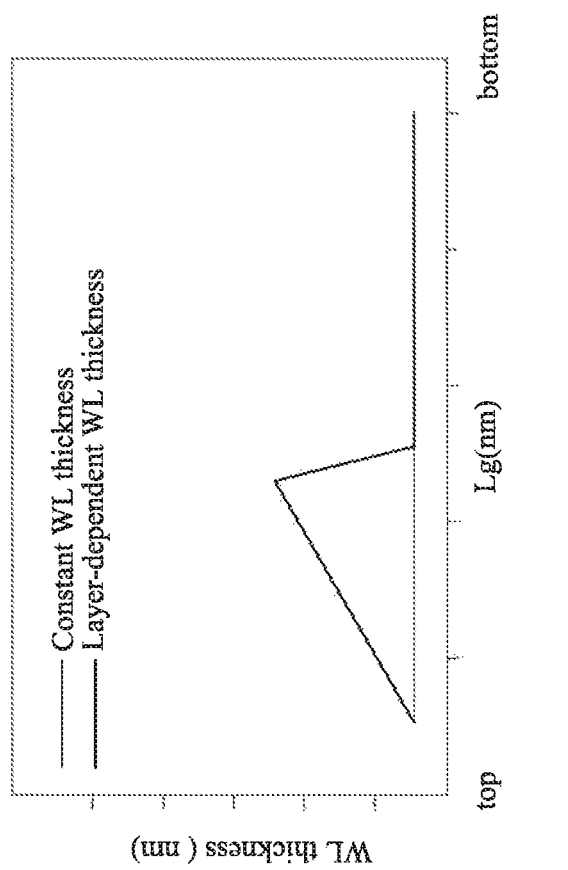
Figure 20B:
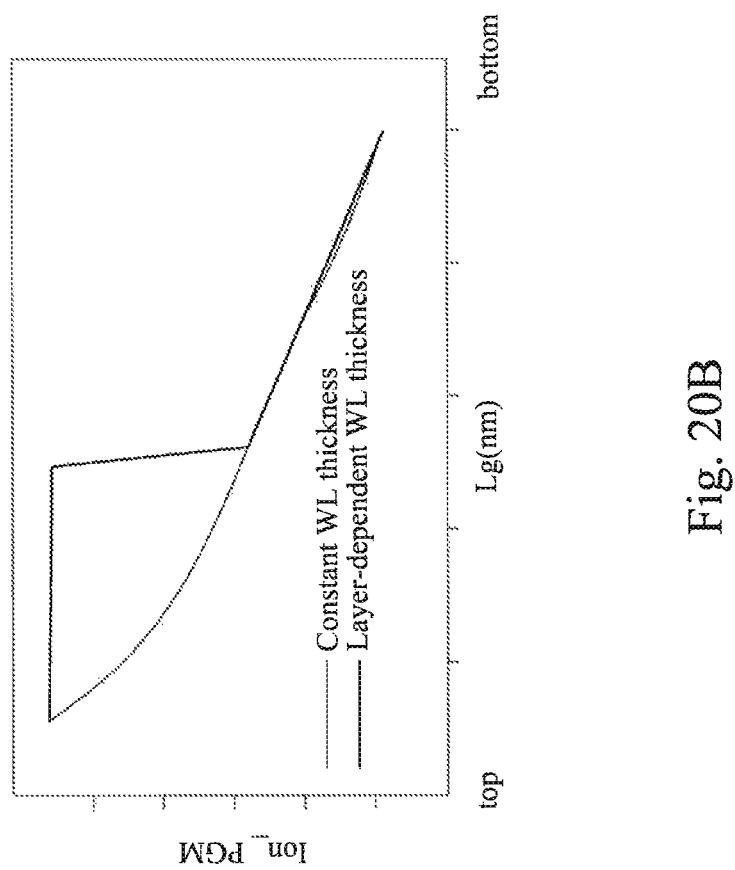
Figure 21A:
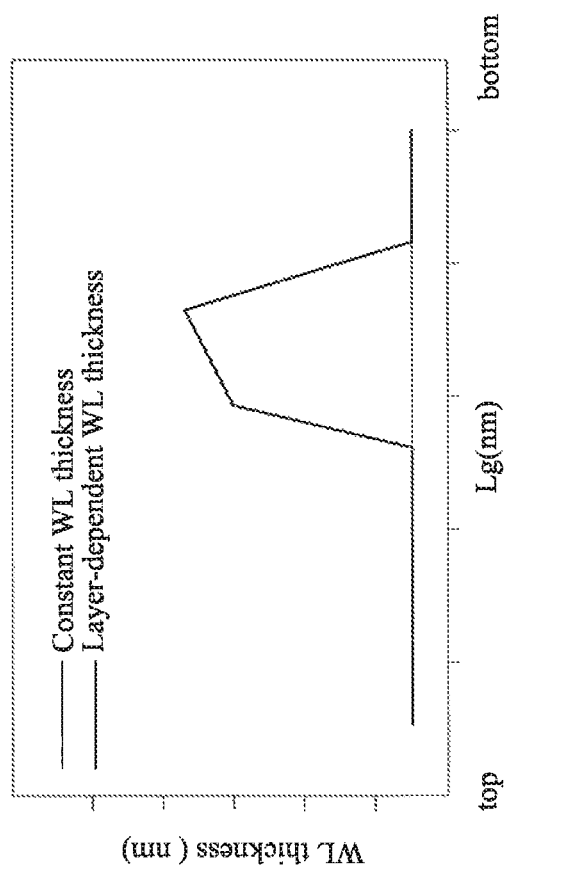
Figure 21B:
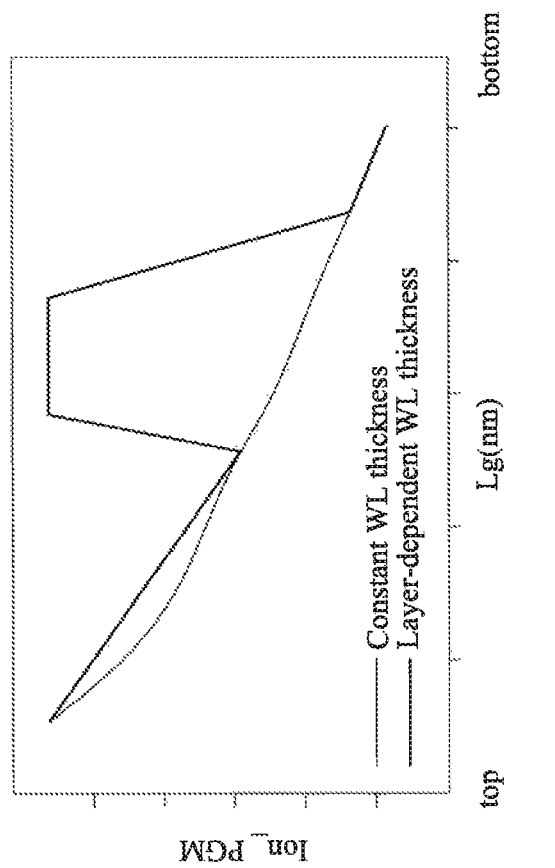

FIGS. 19A-21B illustrate various plots of varying the word line thickness to correspond to channel length and the effect on cell current. Therefore, the present invention is not limited to the embodiments discussed above. FIGS. 19A, 20A, and 21A are plots of the word line thickness as a result of channel length. FIGS. 19B, 20B, and 21B are plots of the cell current versus channel length as a result of varying word line thicknesses that correspond to FIGS. 19A, 20A, and 21A, respectively.

In FIGS. 19A-B, the word line thickness is constant along a first portion of a semiconductor device from the topmost word line to a middle word line and increases linearly with two different slopes along a second portion of the semiconductor device from the middle word line to a bottommost word line. FIG. 19B shows the resulting cell current along the vertical axis of the semiconductor device. When the word line thickness is constant along an increasing channel length, the cell current decreases. When an increasing word line thickness is added along increasing channel lengths, the cell current will increase. When a larger amount of word line thickness is added along channel lengths, the cell current is constant.

In FIGS. 20A-B, the word line thickness increases along a first portion of a semiconductor device from the topmost word line to a middle word line, decreases, and then remains constant until the bottommost word line as shown in FIG. 20A. FIG. 20B shows the resulting cell current along the vertical axis. As word line thickness increases along an increasing channel length, the cell current stays constant. When a constant word line thickness is present, the cell current decreases.

In FIGS. 21A-B, word line thickness stays constant along a first portion of a semiconductor device from the topmost word line to a middle word line, increases, and then decreases until the bottommost word line as shown in FIG. 21A. FIG. 21B shows the resulting cell current along the vertical axis. When the word line thickness remains constant along an increasing channel length, the cell current will degrade. An increasing word line thickness results in a constant cell current along the semiconductor device.

FIGS. 19A-21B further demonstrate that modifying the word line thickness to correspond to the channel length compensates for the loss of cell current typically seen in semiconductor devices. Furthermore, the word line thickness does not need to increase or decrease continuously throughout the semiconductor device and can be modified according to the desired outcome. In a semiconductor device that has an increasing channel length from the topmost word line to the bottommost word line, cell current would typically degrade from the topmost word line to the bottommost word line. FIGS. 19A-21B demonstrate that a constant word line thickness leads to a decreasing cell current, an increasing word line thickness leads to an increasing or constant cell current, and a decreasing word line thickness leads to a decreasing cell current.

In one aspect of the present disclosure, a semiconductor device is disclosed. The semiconductor device includes a first conductive structure extending along a vertical direction and a second conductive structure extending along the vertical direction. The second conductive structure is spaced apart from the first conductive structure along a lateral direction. The semiconductor device further comprises a plurality of third conductive structures each extending along the lateral direction. The plurality of third conductive structures are disposed across the first and second conductive structures. The first and second conductive structures each have a varying width along the lateral direction. The plurality of third conductive structures have respective different thicknesses in accordance with the varying width of the first and second conductive structures.

In another aspect of the present disclosure, a memory device is disclosed. The memory device includes a first bit/source line extending along a vertical direction and a second bit/source line extending along the vertical direction. The memory device further comprises a plurality of first word lines each extending along a first lateral direction. The memory device further comprises a first memory film extending along the vertical direction. The first memory film is in contact with the plurality of first word lines. The memory device further comprises a first semiconductor channel extending along the vertical direction. The first semiconductor channel is in contact with the first and second bit/source lines and with the first memory film on respective sides. The first and second bit/source lines each have a width extending along the first lateral direction. The width increases in accordance with an increasing height of the first and second bit/source lines. The plurality of first word lines have respective thicknesses. The thicknesses decrease from a bottommost one of the plurality of first word lines to a topmost one of the plurality of first word lines.

In yet another aspect of the present disclosure, a method for fabricating memory devices is disclosed. The method includes providing a stack comprising a plurality of insulating layers and a plurality of sacrificial layers alternatively stacked on top of each other. The sacrificial layers have respective different thicknesses. The method further comprises forming a trench extending through the stack in a lateral direction, forming a memory film extending along sidewalls of the trench, and forming a semiconductor channel extending along the sidewalls of the trench. The method further comprises replacing the plurality of sacrificial layers with a plurality of first conductive structures, respectively, wherein the plurality of first conductive structures extend in the lateral direction and inherit the different thicknesses. The method further comprises forming a second conductive structure and a third conductive structure extending along a vertical direction. The second and third conductive structures are in contact with end portions of a sidewall of the semiconductor channel, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating memory devices, comprising:
providing a substrate;
forming a stack comprising alternating insulating layers and sacrificial layers arranged along a vertical direction;
forming a trench extending through the stack and along a lateral direction;
replacing the sacrificial layers with first conductive structures, wherein the first conductive structures extend along the lateral direction;
forming a memory film extending along a sidewall of each first conductive structure;
forming a semiconductor channel along a sidewall of the memory film; and
forming a second conductive structure and a third conductive structure extending along the vertical direction, wherein the second conductive structure and the third conductive structure are in contact with end portions of a sidewall of the semiconductor channel, and wherein widths of the first conductive structures along the lateral direction vary along the vertical direction.

2. The method of claim 1, wherein the step of forming the semiconductor channel includes:
forming a semiconductor layer along the sidewall of the memory film; and
patterning the semiconductor layer to form the semiconductor channel, wherein the semiconductor channel exposes portions of the memory film in the trench.

3. The method of claim 1, further comprising filling the trench with an insulation layer to form an inner spacer and an isolation structure, wherein the inner spacer is in contact with the sidewall of the semiconductor channel and the isolation structure is in contact with the sidewall of the memory film.

4. The method of claim 3, wherein the step of forming the second conductive structure and the third conductive structure includes:
etching end portions of the inner spacer to form cavities adjacent the end portions of the sidewall of the semiconductor channel; and
filling the cavities with a conductive material to form the second conductive structure and the third conductive structure.

5. The method of claim 1, wherein the memory film includes a ferroelectric layer.

6. The method of claim 1, wherein the step of forming the stack includes forming the sacrificial layers to have thicknesses that vary along the vertical direction such that the first conductive structures have thicknesses that also vary along the vertical direction.

7. The method of claim 1, wherein the widths of the first conductive structures decrease continuously along the vertical direction from a top portion of the stack towards a bottom portion of the stack in contact with the substrate.

8. The method of claim 1, wherein the widths of the first conductive structures first decrease then increase along the vertical direction from a top portion of the stack towards a bottom portion of the stack in contact with the substrate.

9. The method of claim 1, wherein the widths of the first conductive structures first increase then decrease along the vertical direction from a top portion of the stack towards a bottom portion of the stack in contact with the substrate.

10. A method for fabricating memory devices, comprising:
providing a substrate;
forming a stack comprising alternating insulating layers and sacrificial layers arranged along a vertical direction, wherein thicknesses of the sacrificial layers vary along the vertical direction;
forming a trench extending through the stack and along a lateral direction;
replacing the sacrificial layers with word line (WL) structures, wherein the WL structures extend along the lateral direction;
forming a memory film extending along a sidewall of each first conductive structure;
forming a semiconductor channel that partially covers a sidewall of the memory film; and
forming a source line (SL) structure and a bit line (BL) structure extending along the vertical direction, wherein the SL structure and BL structure are in contact with end portions of a sidewall of the semiconductor channel.

11. The method of claim 10, wherein the step of forming the SL structure and BL structure results in widths of the WL structures along the lateral direction to vary along the vertical direction.

12. The method of claim 11, wherein the widths of the WL structures vary according to a variation of the thicknesses of the WL structures.

13. The method of claim 10, wherein the step of forming the semiconductor channel includes:
forming a semiconductor layer along the sidewall of the memory film; and
etching the semiconductor layer such that remaining portions of the semiconductor layer partially cover the memory film as the semiconductor channel.

14. The method of claim 10, wherein each of the WL structures, the SL structure, the BL structure, a portion of the memory film, and a portion of the semiconductor channel collectively form a memory cell, the method further comprising filling the trench with an isolation structure, wherein the isolation structure is in contact with the sidewall of the memory film, and wherein the isolation structure separates the memory cell from an adjacent memory cell.

15. The method of claim 10, further comprising filling the trench with an insulating inner spacer, wherein the insulating inner spacer is in contact with the sidewall of the semiconductor channel, and wherein the step of forming the SL structure and BL structure includes:
etching end portions of the insulating inner spacer to form cavities adjacent the end portions of the sidewall of the semiconductor channel; and
filling the cavities with a conductive material to form the SL structure and BL structure.

16. The method of claim 10, wherein the thicknesses of the WL structures decrease continuously along the vertical direction from a top portion of the stack towards a bottom portion of the stack in contact with the substrate.

17. The method of claim 10, wherein the thicknesses of the WL structures first decrease then increase along the vertical direction from a top portion of the stack towards a bottom portion of the stack in contact with the substrate.

18. The method of claim 10, wherein the thicknesses of the WL structures first increase then decrease along the vertical direction from a top portion of the stack towards a bottom portion of the stack in contact with the substrate.

19. A method for fabricating memory devices, comprising:
   providing a substrate;
   forming a stack comprising alternating insulating layers and sacrificial layers arranged along a vertical direction, wherein thicknesses of the sacrificial layers vary along the vertical direction;
   forming a trench extending through the stack and along a lateral direction;
   replacing the sacrificial layers with first conductive structures, wherein the first conductive structures extend along the lateral direction;
   forming a memory film extending along a sidewall of each first conductive structure;
   forming a semiconductor channel along a sidewall of the memory film; and
   forming a second conductive structure and a third conductive structure extending along the vertical direction, wherein the second conductive structure and the third conductive structure are in contact with end portions of a sidewall of the semiconductor channel, and wherein widths of the first conductive structures extending along the lateral direction vary along the vertical direction.

20. The method of claim 19, wherein the widths of the first conductive structures vary according to a variation of the thicknesses of the sacrificial layers.

* * * * *